(12) United States Patent
O'Donnell et al.

(10) Patent No.: US 7,427,887 B2
(45) Date of Patent: Sep. 23, 2008

(54) OPEN DRAIN DRIVER, AND A SWITCH COMPRISING THE OPEN DRAIN DRIVER

(75) Inventors: John J. O'Donnell, Quinn (IE); Michael Christian Wohnsen Coln, Lexington, MA (US); Maria del Mar Chamarro Marti, Valencia (ES)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/129,240

(22) Filed: May 13, 2005

(65) Prior Publication Data

US 2006/0255852 A1 Nov. 16, 2006

(51) Int. Cl.
*H03K 17/687* (2006.01)
(52) U.S. Cl. ...................... 327/434; 324/404
(58) Field of Classification Search ........... 327/108, 327/109, 376, 377, 382, 383, 389, 403, 404, 327/408, 419, 427, 434, 486, 488
See application file for complete search history.

(56) References Cited

U.S. PATENT DOCUMENTS

| | | | | |
|---|---|---|---|---|
| 3,970,869 | A | * | 7/1976 | Coats, Jr. ............... 327/374 |
| 4,316,101 | A | * | 2/1982 | Minner ................. 327/434 |
| 4,678,950 | A | | 7/1987 | Mitake |
| 4,707,622 | A | | 11/1987 | Takao et al. |
| 4,760,433 | A | | 7/1988 | Young et al. |
| 4,763,021 | A | | 8/1988 | Stickel |
| 4,855,620 | A | | 8/1989 | Duvvury et al. |

(Continued)

*Primary Examiner*—N. Drew Richards
*Assistant Examiner*—Thomas J Hiltunen
(74) *Attorney, Agent, or Firm*—Wolf, Greenfield & Sacks, P.C.

(57) ABSTRACT

An open drain driver (7) selectively switches a MOSFET switch (MN1) which is passively held in the conducting state into the non-conducting state. The MOSFET switch (MN1) switches an AC analogue input signal on a main input terminal (3) to a main output terminal (4) and the gate of the MOSFET switch (MN1) is AC coupled by a capacitor (C1) to the drain thereof. The open drain driver (7) comprises a first MOSFET (MN2) and a second MOSFET (MN3) through which the gate of the MOSFET switch (MN1) is pulled to ground ($V_{ss}$). The gate of the first MOSFET (MN2) is coupled to the supply voltage ($V_{DD}$) for maintaining the first MOSFET (MN2) in the open state. A control signal is applied to the gate of the second MOSFET (MN3) for selectively operating the open drain driver (7) in the conducting state for operating the MOSFET switch (MN1) in the non-conducting state. When the second MOSFET (MN3) is in the non-conducting state, the first MOSFET (MN2) remains in the conducting state until the voltage on a coupling node (9) between the first and second MOSFETs (MN2,MN3) equals the difference between its gate voltage and its threshold voltage, at which stage, any over-voltages applied to the gate of the MOSFET switch (MN1) are divided between the first and second MOSFETs (MN2,MN3). A coupling diode (D1) coupling the coupling node (9) to the supply voltage ($V_{DD}$) clamps the voltage on the coupling node (9) at the supply voltage ($V_{DD}$) plus the conducting voltage of the diode (D1), in the event of the voltage on the coupling node (9) rising after the first MOSFET (MN2) has gone into the non-conducting state. The coupling node (9) may be capacitively coupled to the supply voltage ($V_{DD}$) by a coupling capacitor instead of or as well as the diode (D1) for limiting the voltage on the coupling node (9).

43 Claims, 5 Drawing Sheets

U.S. PATENT DOCUMENTS

| | | | |
|---|---|---|---|
| 4,988,902 A * | 1/1991 | Dingwall | 327/382 |
| 5,028,819 A | 7/1991 | Wei et al. | |
| 5,874,836 A * | 2/1999 | Nowak et al. | 326/83 |
| 6,177,818 B1 * | 1/2001 | Bertin et al. | 327/108 |
| 6,320,414 B1 * | 11/2001 | Annema et al. | 326/80 |
| 6,894,468 B1 * | 5/2005 | Bretz et al. | 323/274 |
| 7,002,405 B2 * | 2/2006 | Brooks et al. | 327/563 |
| 2003/0090313 A1 * | 5/2003 | Burgener et al. | 327/408 |
| 2004/0196089 A1 | 10/2004 | O'Donnell et al. | |

* cited by examiner

Logic signal
0 = MN3 off
   = MN1 on

OPEN DRAIN DRIVER, AND A SWITCH COMPRISING THE OPEN DRAIN DRIVER

FIELD OF THE INVENTION

The present invention relates to an open drain driver, and a switch circuit comprising a transistor switch operating under the control of an open drain driver. The invention also relates to a method for providing an open drain driver with improved over-voltage breakdown protection.

BACKGROUND TO THE INVENTION

Open drain drivers are well known, and have many applications. For example, open drain drivers are commonly used for driving a low signal from an associated circuit onto a shared bus to a remote external circuit. The advantage of using an open drain driver in such an application is that when the open drain driver is not required to drive the low signal onto the shared bus, the open drain driver is in a high impedance state, thereby isolating its associated circuit from the shared bus. In such cases, where a plurality of circuits are sharing a bus, the rated supply voltages of the circuits may vary depending on the type of circuit. Some circuits may be operating with a rated supply voltage as low as one volt, while others may be operating with a rated supply voltage of five volts or greater. Accordingly, a high voltage applied to the shared bus by a circuit operating with a high rated supply voltage may be sufficient to exceed the reliability limit of an open drain driver of a lower supply voltage rated circuit sharing the bus. This, in turn, would lead to failure of such an open drain driver.

Open drain drivers are also used for operating transistor switches where the gate of the transistor switch is passively held in one of a logic high state and a logic low state in order to operate the transistor switch in the corresponding one of the conducting and non-conducting states, and the other of the logic high and logic low states for operating the transistor in the other of the conducting and non-conducting states is to be derived from a different source, and in particular, where it is desired that when the transistor switch is operating in response to the gate of the transistor being passively held the one of the logic high and logic low states, the source which provides the said other of the logic high and logic low states presents the gate of the transistor switch with a high impedance, so that the gate of the transistor switch is effectively isolated from the source from which the said other of the said logic high and logic low state is derived. In such cases, an open drain driver is commonly used to apply the alternative logic state to the gate of the transistor switch to that of the passively applied logic state. The advantage of applying one of the logic states to the gate of a transistor switch through an open drain driver is that when the open drain driver is not applying the logic state to the gate of the transistor switch, the open drain driver presents a high impedance to the gate of the transistor switch. Accordingly, if the open drain driver is used to apply the logic state for operating a transistor switch in the non-conducting state, the open drain driver has little or no effect on the signal being switched through the transistor switch when the transistor switch is operating in the conducting state, since the open drain driver presents a high impedance to the gate of the transistor switch when the transistor switch is in the conducting state.

Open drain drivers typically comprise a single field effect transistor (FET) through which the logic state to be applied to the gate of the transistor switch is coupled. A control signal applied to the gate of the single FET selectively operates the FET in the conducting and non-conducting states, so that when in the conducting state, the FET applies the logic state to the gate of the transistor switch, and when in the non-conducting state the FET becomes a high impedance, which thus presents the gate of the transistor switch with a high impedance.

Open drain drivers which comprise a single FET suffer from a serious disadvantage when operating in low supply voltage rated environments, in particular, in CMOS environments, which are designed to operate at rated supply voltages of the order of 5 volts, and in many cases at rated supply voltages of the order of 3.3 volts, and in some cases, at rated supply voltages as low as 1 volt. In such cases the single FET of an open drain driver when operating in the high impedance state cannot tolerate voltages which exceed the rated supply voltage by an amount equal to approximately 10% of the supply voltage. Accordingly, if a shared bus to which an open drain driver is coupled is subjected to a voltage greater than the rated supply voltage of the FET of the open drain driver by an amount equal to approximately 10% of the rated supply voltage when the open drain driver is in the high impedance state, the single FET will fail as a result of the over-voltage. Similarly, in a case where an open drain driver is used to apply the one of a logic high or a logic low state to the gate of a transistor switch, if the gate of the transistor switch is subjected to a voltage higher than the rated supply voltage plus 10% of the single FET of the open drain driver, the single FET will fail as a result of the over-voltage.

In CMOS applications where a MOSFET switch is switching an AC signal, linearity problems arise in the MOSFET switch. The on-resistance of a MOSFET switch varies with the voltage difference across the gate and source or the gate and drain of the MOSFET switch. Thus, as the voltage of the AC signal on the drain-source of the MOSFET switch varies from peak to peak, the voltage across the gate and drain and the gate and source of the MOSFET switch also varies, thereby varying the on-resistance of the MOSFET switch and in turn compromising the linearity of the AC signal switched through the MOSFET switch.

Circuits which overcome the linearity problem of MOSFET switches when switching an AC signal, are disclosed in U.S. published Patent Application No. 2004/0196089, which was filed on Apr. 3, 2003 in the name of John O'Donnell, et al, who is one of the inventors of the present invention, and entitled "Switching Device". U.S. Application Specification No. 2004/0196089 discloses a MOSFET switch in which the gate is AC coupled to either the source or the drain for maintaining the voltage difference between the gate and the source or drain constant as the voltage of the AC signal varies from peak to peak. However, if such an AC coupled MOSFET switch were passively held in the conducting state and held in the non-conducting state by a logic signal applied to the gate through an open drain driver, the open drain driver would be subjected to the AC voltage which is AC coupled to the gate of the MOSFET switch, and this could result in an over-voltage being applied to the open drain driver when the open drain driver is in the high impedance state, which in turn would lead to failure of the open drain driver.

An open drain driver is disclosed in U.S. Pat. No. 5,028,819 of Wei, et al, which to some extent overcomes the problem of the drain-source voltage of the MOSFET of a single MOSFET open drain driver exceeding the rated supply voltage. Wei proposes the use of two MOSFETs in series in the open drain driver in order to divide any over-voltages to which the open drain driver is subjected across the two MOSFETs, thereby reducing the likelihood of over-voltage failure. In the open drain driver of Wei the drain of the first MOSFET forms the output of the open drain driver, and the source of the first MOSFET is coupled to the drain of a second MOSFET. The source of the second MOSFET is coupled to a voltage source which is to be applied to the output of the open drain driver, when the open drain driver is in a conducting state. The MOSFETs of Wei are N-channel MOSFETs, and the gate of the first MOSFET is constantly biased to the supply voltage $V_{DD}$, so that the first MOSFET is normally operating in the conducting state. The gate of the second MOSFET is coupled to a control voltage, which selectively and alternately operates the second MOSFET in the non-conducting and conducting states for in turn operating the open drain driver in the non-conducting high impedance state, and in the conducting state for applying the voltage on the source of the second MOSFET to the output of the open drain driver. In the event of an over-voltage being applied to the output of the open drain driver when the open drain driver is in the high impedance state, the first MOSFET conducts until the voltage on the source of the first MOSFET reaches the difference between the voltage on the gate of the first MOSFET and the threshold voltage of the first MOSFET. At that stage the first MOSFET goes into the non-conducting state, and thus the over-voltage applied to the drain of the first MOSFET is divided between the first and second MOSFETs.

However, a problem with the open drain driver of Wei is that the voltage on a node through which the source of the first MOSFET is coupled to the drain of the second MOSFET can increase to a level which exceeds the permitted reliability voltage limit of the second MOSFET, and in certain cases, the first MOSFET. For example, when the first MOSFET is in a non-conducting state as a result of an over-voltage having been applied to its drain, DC current can leak through the first MOSFET. If the rate of current leakage through the first MOSFET is greater than that through the second MOSFET, the voltage on the node coupling the source of the first MOSFET to the drain of the second MOSFET can rapidly reach the breakdown voltage of the second MOSFET. Additionally, when an AC voltage signal is superimposed on a DC voltage on the output terminal of the open drain driver, or when the output terminal of the open drain driver is subjected to a sudden voltage surge, and the open drain driver is in the high impedance state with the first MOSFET in the conducting state, if during a part of the AC cycle of the AC voltage signal, the combined AC and DC voltages, which will appear on the source of the first MOSFET is such that the gate-source voltage of the first MOSFET becomes less than the threshold voltage of the first MOSFET, the first MOSFET will operate in the non-conducting state during that part of the AC cycle of the AC signal while the gate-source voltage of the first MOSFET remains less than the threshold voltage of the first MOSFET. However, since the AC signal and/or the sudden voltage surge will be capacitively coupled to the node coupling the drain of the second MOSFET to the source of the first MOSFET by the drain-source parasitic capacitance of the first MOSFET while the first MOSFET is in the non-conducting state, the voltage on the node coupling the drain of the second MOSFET to the source of the first MOSFET can rise to a level exceeding the breakdown voltage of the second MOSFET. This thus leads to failure of the second MOSFET.

There is therefore a need for an open drain driver with improved over-voltage protection.

The present invention is directed towards providing an open drain driver with improved over-voltage protection, and the invention is also directed towards providing a transistor switch incorporating such an open drain driver, and the invention is also directed towards providing a method for providing an open drain driver with improved over-voltage protection.

SUMMARY OF THE INVENTION

According to the invention there is provided an open drain driver comprising:
a first transistor having a source, a drain coupled to an output node of the driver, and a gate coupled to a bias voltage node for receiving a bias voltage for maintaining the first transistor in a conducting state while the difference between the voltages on the gate and the source thereof is greater than or equal to the threshold voltage of the first transistor,
a second transistor having a drain coupled to the source of the first transistor through a coupling node, a source coupled to a switching voltage node for receiving a switching voltage, and a gate coupled to a control node for receiving a control signal for operating the second transistor selectively and alternately in a non-conducting state for maintaining the output node in a high impedance state, and a conducting state for applying the switching voltage on the switching voltage node to the output node when the first transistor is in the conducting state, and
a coupling element coupling the coupling node to a reference voltage node for receiving a reference voltage for limiting the voltage on the coupling node when the second transistor is in the non-conducting state, so that the drain-source voltage applied to the second transistor is within the reliability limit of the second transistor.

In one embodiment of the invention the coupling element comprises a DC coupling element for DC coupling the coupling node to the reference voltage node. Preferably, the DC coupling element comprises a diode.

In one embodiment of the invention the first and second transistors are N-type transistors, and the diode is coupled to the coupling node for conducting current from the coupling node to the reference voltage node when the voltage on the coupling node exceeds the reference voltage on the reference voltage node by an amount equivalent to the conducting voltage of the diode.

In another embodiment of the invention the first and second transistors are P-type transistors and the diode is coupled to the coupling node for conducting current to the coupling node from the reference voltage node when the voltage on the coupling node drops below the reference voltage on the reference voltage node by an amount equivalent to the conducting voltage of the diode.

In another embodiment of the invention the conducting voltage of the diode is in the range of 0.4 volts to 0.7 volts.

In a further embodiment of the invention the bias voltage and the reference voltage are applied to the bias voltage node and the reference voltage node, respectively, and are of similar polarity, and the voltage values of the bias voltage and the reference voltage may be the same or different.

In one embodiment of the invention the values of the bias voltage and the reference voltage are greater than the switching voltage applied to the switching voltage node when the first and second transistors are N-type transistors, and the values of the bias voltage and the reference voltage are less than the switching voltage applied to the switching voltage node when the first and second transistors are P-type transistors.

In one embodiment of the invention the coupling element comprises a capacitive coupling element for capacitively coupling the coupling node to the reference voltage node, and the reference voltage node is a low impedance node.

In another embodiment of the invention the capacitive coupling element comprises a coupling capacitor, and preferably, the capacitance of the coupling capacitor is selected so that the sum of the capacitance of the coupling capacitor and the parasitic capacitances of the first and second transistors through which the coupling node is coupled to low impedance nodes is sufficiently greater than the parasitic capacitance of the first transistor between the coupling node and the output node to provide sufficient attenuation of voltages capacitively coupled to the coupling node through the first transistor from the output node to maintain the drain-source voltage applied to the second transistor when the second transistor is in the non-conducting state within the reliability limit of the second transistor.

Preferably, the capacitance of the coupling capacitor is at least one and a half times the parasitic capacitance of the first transistor between the coupling node and the output node when the first and second transistors are of substantially similar size, and advantageously, the capacitance of the coupling capacitor is at least twice the parasitic capacitance of the first transistor between the coupling node and the output node when the first and second transistors are of substantially similar size.

In another embodiment of the invention the coupling element comprises a DC coupling element for DC coupling the coupling node to the reference voltage node, and a capacitive coupling element in parallel with the DC coupling element for capacitively coupling the coupling node to the reference voltage node.

In a further embodiment of the invention the coupling node is capacitively coupled to at least one low impedance node so that the sum of the capacitances through which the coupling node is coupled to low impedance nodes is sufficiently greater than the parasitic capacitance of the first transistor between the coupling node and the output node to provide sufficient attenuation of voltages capacitively coupled to the coupling node through the first transistor from the output node to maintain the drain-source voltage applied to the second transistor when the second transistor is in the non-conducting state within the reliability limit of the second transistor.

In one embodiment of the invention the coupling node is capacitively coupled to the at least one low impedance node through a capacitive coupling element.

In another embodiment of the invention the second transistor is sized relative to the first transistor to provide the capacitive coupling of the coupling node to the at least one low impedance node, and the at least one low impedance node is the switching voltage node and is provided as a low impedance node.

In one embodiment of the invention the first and second transistors are field effect transistors (FETs).

In one embodiment of the invention the open drain driver is implemented in a CMOS process, and preferably, the first and second transistors are MOSFETs.

In another embodiment of the invention each MOSFET comprises a back gate, and preferably, the back gate is electrically tied to one of the drain and source of the MOSFET, and advantageously, the back gate of each MOSFET is electrically tied to the source of the MOSFET.

The invention also provides a switch circuit comprising:
a main input terminal,
a main output terminal,
a transistor switch located between the main input terminal and the main output terminal for selectively coupling the main output terminal to the main input terminal, the transistor switch comprising a source coupled to one of the main input and main output terminals, a drain coupled to the other of the main input and the main output terminals, and a gate coupled to a first control terminal for receiving a first control voltage for holding the transistor switch in one of a conducting state and a non-conducting state, and
an open drain driver having an output node coupled to the gate of the transistor switch for selectively applying a switching voltage to the gate of the transistor switch for operating the transistor switch in the other of the conducting and non-conducting states, the open drain driver comprising:
a first transistor having a source, a drain coupled to the output node thereof, and a gate coupled to a bias voltage node for receiving a bias voltage for maintaining the first transistor in a conducting state while the difference between the voltages on the gate and the source thereof is greater than or equal to the threshold voltage of the first transistor,
a second transistor having a drain coupled to the source of the first transistor through a coupling node, a source coupled to a switching voltage node for receiving the switching voltage, and a gate coupled to a control node for receiving a control signal for operating the second transistor selectively and alternately in a non-conducting state for maintaining the output node of the open drain driver in a high impedance state, and a conducting state for applying the switching voltage to the output node of the open drain driver, and in turn to the gate of the transistor switch when the first transistor is in the conducting state for operating the transistor switch in the other of the conducting state and the non-conducting state, and
a coupling element coupling the coupling node to a reference voltage node for receiving a reference voltage for limiting the voltage on the coupling node when the second transistor is in the non-conducting state, so that the drain-source voltage applied to the second transistor is within the reliability limit of the second transistor.

In one embodiment of the invention the first and second transistors are provided by N-type transistors when the transistor switch is an N-type switch, and the first and second transistors are provided by P-type transistors when the transistor switch is a P-type transistor.

In another embodiment of the invention the gate of the transistor switch is AC coupled to one of the source and drain thereof for maintaining the voltage difference between the gate and the one of the source and drain to which the gate is AC coupled substantially constant when the one of the source and drain to which the gate is AC coupled is subjected to an AC signal.

In a further embodiment of the invention the transistor switch is held in the conducting state by the first control voltage, and the transistor switch is held in the non-conducting state by the switching voltage, and when the transistor switch is held in the conducting state by the first control voltage, the open drain driver presents a high impedance to the gate of the transistor switch.

Additionally, the invention provides a switch circuit comprising:
a main input terminal,
a main output terminal,
a switching circuit located between the main input terminal and the main output terminal for selectively coupling the main output terminal to the main input terminal, the switching circuit comprising an N-type transistor switch, and a P-type transistor switch arranged parallel to each other, with the drain of one of the transistor switches and the source of the other of the transistor switches being coupled together and being coupled to one of the main input and main output terminals, and the others of the source and drain of the respective transistor switches being coupled together and being coupled to the other of the main input and main output terminals, the N-type transistor switch having a gate coupled to a corresponding first control terminal for receiving a corresponding first control voltage for holding the N-type transistor switch in one of a conducting state and a non-conducting state, and the P-type transistor switch having a gate coupled to a second control terminal for receiving a second control voltage for holding the P-type transistor switch in one of the conducting and non-conducting states similar to the state of the N-type transistor switch, a first open drain driver having a corresponding output node coupled to the gate of the N-type transistor switch for applying a first switching voltage to the N-type transistor switch for operating the N-type transistor switch in the other of the conducting and non-conducting states, the first open drain driver comprising a corresponding first transistor having a source, a drain coupled to the corresponding output node of the first open drain driver, and a gate coupled to a first bias voltage node for receiving a first bias voltage for maintaining the first transistor in a conducting state while the difference between the voltages on the gate and the source thereof is greater than or equal to the threshold voltage of the first transistor, a corresponding second transistor having a drain coupled to the source of the corresponding first transistor through a coupling node, a source coupled to a first switching voltage node for receiving the first switching voltage, and a gate coupled to a corresponding control node for receiving a corresponding control signal for operating the second transistor selectively and alternately in a non-conducting state for maintaining the corresponding output node in a high impedance state, and a conducting state for coupling the first switching voltage to the corresponding output node when the corresponding first transistor is in the conducting state, and a corresponding coupling element for coupling the corresponding coupling node to a first reference voltage node for receiving a first reference voltage for limiting the voltage on the corresponding coupling node when the second transistor is in the non-conducting state, so that the drain-source voltage applied to the second transistor of the first open drain driver is within the reliability limit of the second transistor thereof, and a second open drain driver having a corresponding output node coupled to the gate of the P-type transistor switch for applying a second switching voltage to the P-type transistor switch for operating the P-type transistor switch in the other of the conducting and non-conducting states similar to the state of the N-type transistor switch, the second open drain driver comprising a corresponding first transistor having a source, a drain coupled to the corresponding output node of the second open drain driver, and a gate coupled to a second bias voltage node for receiving a second bias voltage for maintaining the first transistor in a conducting state while the difference between the voltages on the gate and the source thereof is greater than or equal to the threshold voltage of the first transistor, a corresponding second transistor having a drain coupled to the source of the corresponding first transistor through a corresponding coupling node, a source coupled to a second switching voltage node for receiving the second switching voltage, and a gate coupled to a corresponding control node for receiving a corresponding control signal for operating the second transistor selectively and alternately in a non-conducting state for maintaining the corresponding output node in a high impedance state, and a conducting state for coupling the second switching voltage to the corresponding output node when the corresponding first transistor is in the conducting state, and a coupling element for coupling the corresponding coupling node to a second reference voltage node for receiving a second reference voltage for limiting the voltage on the corresponding coupling node when the corresponding second transistor is in the non-conducting state, so that the drain-source voltage applied to the second transistor of the second open drain driver is within the reliability limit of the second transistor thereof.

In one embodiment of the invention the coupling element of at least one of the first and second open drain drivers comprises a DC coupling element for DC coupling the corresponding coupling node to the corresponding one of the first and second reference voltage nodes, and preferably, the coupling element of each of the first and second open drain drivers comprises a DC coupling element for DC coupling the corresponding coupling node to the corresponding one of the first and second reference voltage nodes.

In another embodiment of the invention the coupling element of at least one of the first and second open drain drivers comprises a capacitive coupling element for capacitively coupling the corresponding coupling node to the corresponding one of the first and second reference voltage nodes, and the corresponding one of the first and second reference voltage nodes is a low impedance node, and preferably, the coupling element of each of the first and second open drain drivers comprises a capacitive coupling element for capacitively coupling the corresponding coupling node to the corresponding one of the first and second reference voltage nodes, and the corresponding ones of the first and second reference voltage nodes are low impedance nodes.

In a further embodiment of the invention the coupling element of at least one of the first and second open drain drivers comprises a DC coupling element for DC coupling the corresponding coupling node to the corresponding one of the first and second reference voltage nodes, and a capacitive coupling element in parallel with the DC coupling element for capacitively coupling the corresponding coupling node to the corresponding one of the first and second reference voltage nodes, and preferably, the coupling element of each of the first and second open drain drivers comprises a DC coupling element for DC coupling the corresponding coupling node to the corresponding one of the first and second reference voltage nodes, and a capacitive coupling element in parallel with the DC coupling element for capacitively coupling the corresponding coupling node to the corresponding one of the first and second reference voltage nodes.

In another embodiment of the invention the coupling node of at least one of the first and second open drain drivers is capacitively coupled to at least one low impedance node of the open drain driver, so that the sum of the capacitances through which the coupling node is coupled to low impedance nodes of the open drain driver is sufficiently greater than the parasitic capacitance of the first transistor between the coupling node and the output node of the open drain driver to provide sufficient attenuation of voltages capacitively coupled to the coupling node through the first transistor from the output node of the open drain driver to maintain the drain-source voltage applied to the corresponding second transistor of the open drain driver when the corresponding second transistor is in the non-conducting state within the reliability limit of the corresponding second transistor.

In one embodiment of the invention the coupling node of the at least one of the first and second open drain drivers is capacitively coupled to the at least one low impedance node of the open drain driver through a capacitive coupling element, which preferably, comprises a capacitor.

In another embodiment of the invention the second transistor is sized relative to the first transistor of the at least one of the first and second open drain drivers to provide the capacitive coupling of the coupling node to the at least one low impedance node of the open drain driver, and the at least one low impedance node is the switching voltage node of the open drain driver and is provided as a low impedance node.

Further the invention provides an open drain driver comprising:
 a first transistor having a source, a drain coupled to an output node of the driver, and a gate coupled to a bias voltage node for receiving a bias voltage for maintaining the first transistor in a conducting state while the difference between the voltages on the gate and the source thereof is greater than or equal to the threshold voltage of the first transistor,
 a second transistor having a drain coupled to the source of the first transistor through a coupling node, a source coupled to a switching voltage node for receiving a switching voltage, and a gate coupled to a control node for receiving a control signal for operating the second transistor selectively and alternately in a non-conducting state for maintaining the output node in a high impedance state, and a conducting state for applying the switching voltage on the switching voltage node to the output node when the first transistor is in the conducting state,
 wherein the coupling node is capacitively coupled to at least one low impedance node, so that the sum of the capacitances through which the coupling node is coupled to low impedance nodes is sufficiently greater than the parasitic capacitance of the first transistor between the coupling node and the output node to provide sufficient attenuation of voltages capacitively coupled to the coupling node through the first transistor from the output node to maintain the drain-source voltage applied to the second transistor when the second transistor is in the non-conducting state within the reliability limit of the second transistor.

In one embodiment of the invention the coupling node is capacitively coupled to the at least one low impedance node through a capacitive coupling element, which preferably, comprises a capacitor.

In another embodiment of the invention the low impedance node is one of a reference voltage node and the switching voltage node.

In a further embodiment of the invention the second transistor is sized relative to the first transistor to provide the capacitive coupling of the coupling node to the at least one low impedance node, and the at least one low impedance node is the switching voltage node and is provided as a low impedance node.

The invention also provides a method for providing an open drain driver with over-voltage breakdown protection, the method comprising the steps of:
 providing a first transistor having a source, a drain coupled to an output node of the open drain driver, and a gate coupled to a bias voltage node to which a bias voltage is applied for maintaining the first transistor in a conducting state while the difference between the voltages on the gate and the source thereof is greater than or equal to the threshold voltage of the first transistor,
 providing a second transistor having a drain coupled to the source of the first transistor through a coupling node, a source coupled to a switching voltage node for receiving a switching voltage, and a gate for receiving a control signal for operating the second transistor selectively and alternately in a non-conducting state for maintaining the output node in a high impedance state, and a conducting state for coupling the switching voltage on the switching voltage node to the output node when the first transistor is in the conducting state, and
 coupling the coupling node through a coupling element to a reference voltage node to which a reference voltage is applied for limiting the voltage on the coupling node when the second transistor is in the non-conducting state, so that the drain-source voltage applied to the second transistor is within the reliability limit of the second transistor.

In one embodiment of the invention the coupling node is DC coupled to the reference voltage node by a DC coupling element, and preferably, the DC coupling element comprises a diode.

In another embodiment of the invention the coupling node is capacitively coupled to the reference voltage node by a capacitive coupling element, and the reference voltage node is a low impedance node.

In a further embodiment of the invention the coupling node is coupled to the reference voltage node by a DC coupling element and a capacitive coupling element in parallel with the DC coupling element.

The invention further provides a method for providing an open drain driver with over-voltage breakdown protection, the method comprising the steps of:
 providing a first transistor having a source, a drain coupled to an output node of the open drain driver, and a gate coupled to a bias voltage node to which a bias voltage is applied for maintaining the first transistor in a conducting state while the difference between the voltages on the gate and the source thereof is greater than or equal to the threshold voltage of the first transistor,
 providing a second transistor having a drain coupled to the source of the first transistor through a coupling node, a source coupled to a switching voltage node for receiving a switching voltage, and a gate for receiving a control signal for operating the second transistor selectively and alternately in a non-conducting state for maintaining the output node in a high impedance state, and a conducting state for coupling the switching voltage on the switching voltage node to the output node when the first transistor is in the conducting state,
 wherein the coupling node is capacitively coupled to at least one low impedance node, so that the sum of the capacitances through which the coupling node is coupled to low impedance nodes is sufficiently greater than the parasitic capacitance of the first transistor between the coupling node and the output node to provide sufficient attenuation of voltages capacitively coupled to the coupling node through the first transistor from the output node to maintain the drain-source voltage applied to the second transistor when the second transistor is in the non-conducting state within the reliability limit of the second transistor.

In one embodiment of the invention the coupling node is capacitively coupled to the at least one low impedance node through a capacitive coupling element, and additionally or alternatively, the second transistor is sized relative to the first transistor to provide the capacitive coupling of the coupling node to the at least one low impedance node, and the at least one low impedance node is the switching voltage node and is provided as a low impedance node.

ADVANTAGES OF THE INVENTION

The advantages of the open drain driver according to the invention are many. The open drain driver according to the invention is reliable and robust, and is suitable for implementing in low supply voltage rated CMOS environments, and is particularly suitable for use in applying one of the logic high and logic low states to a gate of a transistor switch, which is passively held in the other of the logic high and logic low states. Since the open drain driver according to the invention is provided with improved over-voltage protection, it is particularly suitable for applying one of the logic low and the logic high states to a gate of a transistor switch, which is passively held in the other of the logic high and logic low states, where such a transistor switch is switching high frequency AC analogue input signals, and in particular, analogue video signals of frequency in the range 27 MHz to 81 MHz, and where the AC signal is capacitively coupled to the gate of the transistor switch, in order to remove variability of the on-resistance of the transistor switch to reduce distortion in the signal being switched by the transistor switch.

Firstly, by virtue of the fact that the open drain driver according to the invention comprises first and second transistors, any over-voltage which is applied to the output of the open drain driver is divided across the first and second transistors, thus minimising the vulnerability of the open drain driver to over-voltages applied to its output node. Secondly, the provision of the coupling element which couples the coupling node to a reference voltage node for limiting the voltage on the coupling node further enhances the over-voltage protection provided in the open drain driver, since by limiting the voltage on the coupling node, the voltage to which the second transistor can be subjected is likewise limited, and can be limited to a value which does not exceed the permitted reliability limit of the second transistor. Accordingly, any danger of the voltage on the coupling node rising or falling, depending on whether the first and second transistors are N-type or P-type transistors as a result of DC currents leaking through the first transistor, or AC currents being capacitively coupled through the first transistor, when the first and second transistors are in the non-conducting state is avoided.

Where the coupling element is provided by a DC coupling element implemented, for example, by a diode, the DC voltage on the coupling node is maintained at a voltage which does not rise above or fall below the reference voltage which is applied to the reference voltage node by the value of the conducting voltage of the diode, depending on whether the first and second transistors are N-type or P-type transistors. By capacitively coupling the coupling node to the reference voltage node, or any other low impedance node, the voltage, resulting from capacitive coupling of the coupling node to the output node through the parasitic capacitance of the first transistor, to which the coupling node can rise or fall, depending on the type of circuit, is limited by the attenuating effect of the coupling capacitor. The attenuation of the voltage capacitively coupled to the coupling node from the output node is a function of the ratio of the parasitic capacitance of the first transistor coupling the coupling node to the output node to the sum of the capacitance of the coupling capacitor and the parasitic capacitances of the first and second transistors which couple the coupling node to low impedance nodes. Accordingly, by appropriately selecting the value of the capacitance of the coupling capacitor, the voltage on the coupling node can be limited to avoid the voltage capacitively coupled to the coupling node from the output node rising to or falling to a voltage which would cause failure of the second transistor, depending on whether the first and second transistors are N-type or P-type transistors.

Capacitive coupling of the coupling node to the reference voltage node or to any other low impedance node provides the advantage that the open drain driver is particularly suitable for use in high frequency AC analogue signal environments. Additionally, the capacitive coupling of the coupling node to the reference voltage node or to any other low impedance node for limiting the voltage capacitively coupled to the coupling node provides the advantage that the open drain driver according to the invention is particularly suitable for low voltage environments, and in particular, for low voltage CMOS environments of rated supply voltages of 3.3 volts, such as CMOS circuits implemented in 0.18 micron CMOS processes, and CMOS circuits with even lower rated supply voltages, such as rated supply voltages as low as one volt.

Additionally, when the open drain driver is used in conjunction with a passively operated transistor switch, in particular, a passively operated MOSFET switch, the open drain driver has the added advantage that when the switch is passively held in an open state, the open drain driver presents a high impedance to the gate of the MOSFET switch, and thus, the open drain driver has little or no effect on the signal being switched by the MOSFET switch. In particular, when the signal being switched by the MOSFET switch is a high frequency analogue AC signal, such as, for example, an analogue video signal at a frequency in the range of 27 MHz to 81 MHz, the signal can be switched with virtually no distortion so that the output signal from the MOSFET switch corresponds to the input signal without distortion. Additionally, by virtue of the fact that the value to which the voltage on the coupling node between the first and second transistors of the open drain driver can rise is limited by virtue of the provision of the coupling element coupling the coupling node to the reference voltage node, and where the coupling element is a capacitive coupling element, coupling the coupling node to any low impedance node, the open drain driver has significantly improved protection against over-voltages which result from the AC signal being switched by the MOSFET, than open drain drivers known heretofore.

By capacitively coupling the coupling node to a low impedance node through either a coupling capacitor or through the parasitic capacitance of the second transistor by appropriately sizing the second transistor relative to the first transistor, the open drain driver can be provided with adequate over-voltage protection against AC signals and sudden DC voltage surges applied to the output node of the open drain driver.

The provision of the switch circuit according to the invention incorporating the open drain driver provides a switch circuit which is particularly suitable for switching analogue AC signals, since the open drain driver is provided with improved over-voltage protection.

These and other advantages of the invention will be readily apparent from the following description of some preferred embodiments thereof, which are given by way of example only, with reference to the accompanying drawings.

DETAILED DESCRIPTION OF PREFERRED EMBODIMENTS

Figure 1:
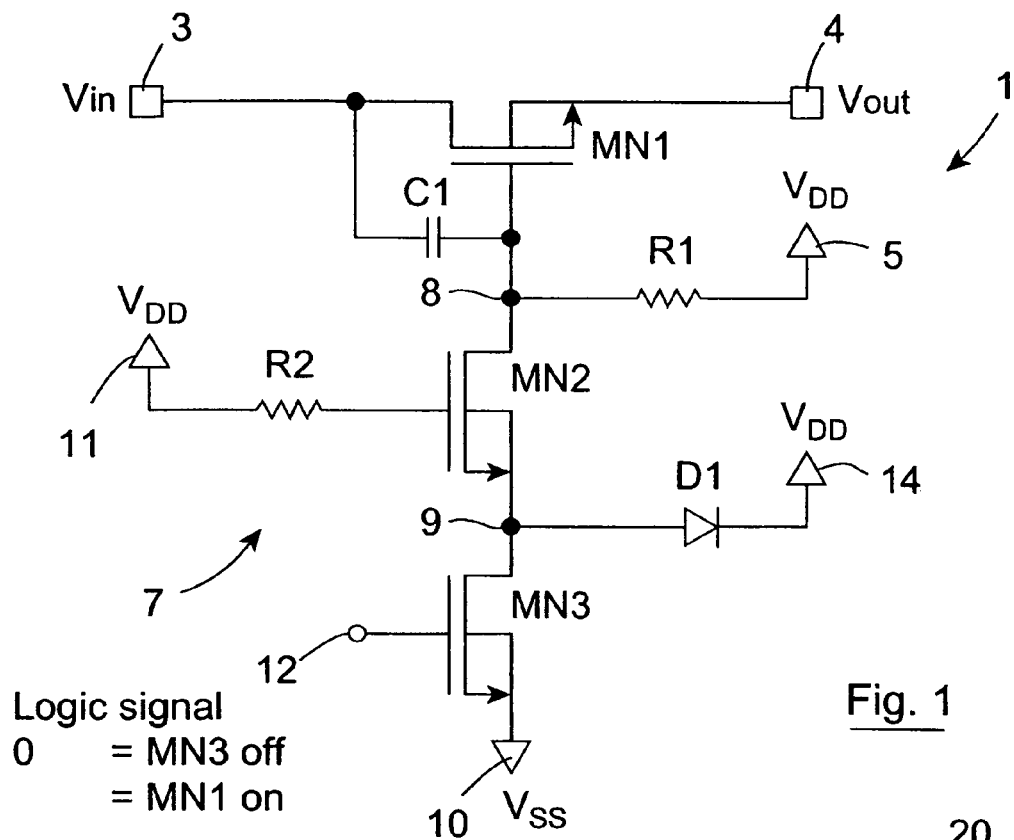
FIG. 1 is a circuit diagram of a switch circuit according to the invention.

Referring to the drawings and initially to FIG. 1, there is illustrated a switch circuit according to the invention, indicated generally by the reference numeral 1 for selectively switching an input signal $V_{in}$. In this case the switch circuit 1 is implemented as a low voltage CMOS integrated circuit, and is particularly suitable for switching a high frequency analogue AC input signal $V_{in}$, for example, an analogue video signal of frequency in the range of 27 MHz to 81 MHz, although needless to say, the switch circuit 1 is suitable for switching any type of signal, both AC and DC.

The switch circuit 1 comprises a main input terminal 3 to which the input signal $V_{in}$ is applied, and a main output terminal 4 to which the input signal $V_{in}$ is switched and appears as $V_{out}$. A transistor switch provided by an N-channel MOSFET switch MN1 located between the main input terminal 3 and the main output terminal 4 selectively switches the input signal $V_{in}$ to the main output terminal 4. In order to maintain the on-resistance of the MOSFET switch MN1 substantially constant as the AC voltage of the input signal $V_{in}$ varies from peak to peak, the difference between the voltages on the gate and the drain of the MOSFET switch MN1 are maintained constant by AC coupling the gate of the MOSFET switch MN1 to the drain thereof by a capacitor C1. This aspect of the switch circuit 1 is described in U.S. published Patent Application Specification No. 2004/0196089, which has already been discussed.

The gate of the MOSFET switch MN1 is coupled through a first pull-up resistor R1 to a first control voltage terminal 5, to which a first control voltage is applied for passively holding the MOSFET switch MN1 in the conducting state. In this embodiment of the invention the first control voltage is the supply voltage $V_{DD}$.

An open drain driver also according to the invention and indicated generally by the reference numeral 7, an output node 8 of which is coupled to the gate of the MOSFET switch MN1 is selectively operable for pulling the gate of the MOSFET switch MN1 to a switching voltage, which in this embodiment of the invention is the negative or ground supply voltage $V_{ss}$ for operating the MOSFET switch MN1 in the non-conducting state, for in turn isolating the main output terminal 4 from the main input terminal 3 of the switch circuit 1.

The open drain driver 7 comprises a first transistor, namely, a first N-channel MOSFET MN2, and a second transistor, namely, a second N-channel MOSFET MN3, across which over-voltages applied to the output node 8 of the open drain driver 7 are divided when the first and second MOSFETs MN2 and MN3 are in the non-conducting state, as will be described below. The first and second MOSFETs MN2 and MN3 are of similar size, and allowing for manufacturing tolerances, the parasitic capacitances of the first and second MOSFETs MN2 and MN3 are substantially similar, as are their respective on-resistances and their respective off-resistances. The drain of the first MOSFET MN2 is coupled to the output node 8 of the open drain driver 7, and the source of the first MOSFET MN2 is coupled to the drain of the second MOSFET MN3 through a coupling node 9. The source of the second MOSFET MN3 is coupled to a switching voltage node 10 to which the switching voltage, namely the supply voltage ground $V_{ss}$, is applied.

The gate of the first MOSFET MN2 is coupled to a bias voltage node 11 through a second pull-up resistor R2, and a bias voltage, in this embodiment of the invention the supply voltage $V_{DD}$ is applied to the bias voltage node 11 for continuously holding the first MOSFET MN2 in the conducting state for so long as the difference of the voltages on the gate and source of the first transistor MN2 is greater than its threshold voltage. The pull-up resistor R2 also provides electrostatic discharge protection for the first MOSFET MN2.

The gate of the second MOSFET MN3 is coupled to a control node 12 for receiving a logic control signal for selectively and alternately operating the second MOSFET MN3 in the conducting state and in the non-conducting state. When the second MOSFET MN3 is in the conducting state the voltage on the gate of the MOSFET switch MN1 is pulled to the supply voltage ground $V_{ss}$ when the first MOSFET MN2 is in the conducting state for, in turn, operating the MOSFET switch MN1 in the non-conducting state for isolating the main output terminal 4 from the main input terminal 3. When the second MOSFET MN3 is in the non-conducting state the open drain driver 7 presents a high impedance to the gate of the MOSFET switch MN1, so that the gate of the MOSFET switch MN1 is passively pulled to the supply voltage $V_{DD}$ for in turn operating the MOSFET switch MN1 in the conducting state. By providing a high impedance to the gate of the MOSFET switch MN1 when the second MOSFET MN3 is in the non-conducting state, the open drain driver 7 has little or no effect on the input signal $V_{in}$ being switched through the MOSFET switch MN1.

While the MOSFET switch MN1 is in the conducting state and the second MOSFET MN3 is in the non-conducting state, the voltage on the coupling node 9 follows the voltage on the gate of the MOSFET switch MN1, until the voltage on the coupling node 9 reaches the difference between the voltage on the gate $V_{DD}$ of the first MOSFET MN2 less the threshold voltage $V_T$ of the first MOSFET MN2, at which stage the first MOSFET MN2 goes into the non-conducting state. Thus, the maximum drain-source voltage to which the second MOSFET MN3 is subjected is the difference between the supply voltage $V_{DD}$ less the threshold voltage $V_T$ of the first MOSFET MN2, before the first MOSFET MN2 stops conducting. Thereafter, any further rise in the gate voltage of the MOSFET switch MN1 is developed across the first MOSFET MN2, unless DC current leaks through the drain-source off-resistance of the first MOSFET MN2 to the coupling node 9. Accordingly, in this way any over-voltages which appear on the output node 8 of the open drain driver 7 when the open drain driver 7 is in the high impedance state are divided across the first and second MOSFETs MN2 and MN3, and the voltage on the coupling node 9 should remain at the value of the difference between the supply voltage $V_{DD}$ and the threshold voltage $V_T$ of the first MOSFET MN2, subject to DC current leakage through the drain-source off-resistance of the first MOSFET MN2, and voltages on the output node 8 which are capacitively coupled to the coupling node 9 through the parasitic capacitance of the first MOSFET MN2. However, in practice, DC current leakage through the drain-source off-resistance of the first MOSFET MN2, and capacitive coupling through the drain-source parasitic capacitance of the first MOSFET MN2 can lead to the voltage on the coupling node 9 rising above the difference between the supply voltage $V_{DD}$ and the threshold voltage $V_T$ of the first MOSFET MN2, when the first MOSFET MN2 is in the non-conducting state. This is particularly so when the DC current leakage through the drain-source off-resistance of the second MOSFET MN3 to the switching voltage node 10 is less than the DC current leakage through the drain-source off-resistance of the first MOSFET MN2, and also when the output node 8 is subjected to excessive AC voltages or sudden DC voltage surges, which are capacitively coupled through the drain-source parasitic capacitance of the first MOSFET MN2 to the coupling node 9.

In order to limit the value to which the DC voltage on the coupling node 9 can rise when the first MOSFET MN2 is in the non-conducting state, a coupling element, which in this embodiment of the invention is a DC coupling element provided by a diode D1 is provided for coupling the coupling node 9 to a low impedance voltage reference node 14. A reference voltage, which in this embodiment of the invention is the supply voltage $V_{DD}$, is applied to the reference voltage node 14, so that on the voltage on the coupling node 9 reaching the value of the supply voltage $V_{DD}$ plus the voltage drop across the diode D1, which typically is 0.48 volts, the voltage on the coupling node 9 is clamped at the supply voltage $V_{DD}$ plus 0.48 volts. Thus, when the first and second MOSFETs MN2 and MN3 are in the non-conducting state, should the voltage on the coupling node 9 commence to rise as a result of DC current leakage from the output node 8, which is not conducted through the second MOSFET MN3 to the switching voltage node 10, the coupling diode D1 clamps the voltage on the coupling node 9 at the value of the supply voltage $V_{DD}$ plus 0.48 volts, thereby preventing failure of the second MOSFET MN3. Additionally, should the voltage on the coupling node 9 reach the value of the supply voltage $V_{DD}$ plus 0.48 volts as a result of capacitive coupling of the AC component of the input signal $V_{in}$ through the drain-source parasitic capacitance of the first MOSFET MN2, or as a result of a sudden voltage surge on the output node 8, which is capacitively coupled through the drain-source parasitic capacitance of the first MOSFET MN2, the coupling diode D1 likewise clamps the voltage on the coupling node 9 at the value of the supply voltage $V_{DD}$ plus 0.48 volts, thus avoiding damage to the second MOSFET MN3.

Additionally, since the diode D1 only conducts when the first MOSFET MN2 is in the non-conducting state, the current drawn by the diode D1 will be minimal, and at maximum will equal the current leaking through the first MOSFET MN2. Therefore, the open drain driver 7 has little or no effect on the signal being switched through the MOSFET switch MN1, irrespective of whether the open drain driver 7 is in the high impedance state or in the conducting state.

In use, when it is desired to operate the MOSFET switch MN1 in the non-conducting state to isolate the main output terminal 4 from the main input terminal 3, the logic control signal on the control node 12 is put into the logic high state, thereby operating the second MOSFET MN3 in the conducting state, and pulling the gate of the MOSFET switch MN1 down to the supply voltage ground $V_{ss}$ on the switching voltage node 10, which in turn operates the MOSFET switch MN1 in the non-conducting state. For so long as the logic control signal is held in the logic high state, the MOSFET switch MN1 is held in the non-conducting state. On the logic control signal being returned to the logic low state, the second MOSFET MN3 goes into the non-conducting state, and the gate of the MOSFET switch MN1 is passively pulled up to the supply voltage $V_{DD}$, operating the MOSFET switch MN1 in the conducting state for switching the input signal $V_{in}$ from the main input terminal 3 to the main output terminal 4.

The critical voltages of the first and second MOSFETs MN2 and MN3 in order to avoid over-voltage breakdown of the first and second MOSFETs MN2 and MN3 are the voltage across the drain and source, namely, the drain-source voltage $V_{ds}$ of each of the first and second MOSFET MN2 and MN3, the voltage across the gate and source, namely, the gate-source $V_{gs}$ of each of the first and second MOSFETs MN2 and MN3, and the voltage across the back gate and source, namely, the back gate-source voltage $V_{bs}$ of each of the first and second MOSFETs MN2 and MN3. In order to avoid over-voltage breakdown of the first and second MOSFETs MN2 and MN3, it is important that these voltages should not exceed a predetermined permitted reliability limit. In general, in a CMOS circuit the permitted reliability limit is the rated supply voltage $V_{DD}$ of the circuit plus 10%. In a CMOS circuit with a rated supply voltage $V_{DD}$ of 5 volts, the drain-source voltage $V_{ds}$, the gate-source voltage $V_{gs}$ and the back gate-source voltage $V_{bs}$ of the first and second MOSFETs MN2 and MN3 should not therefore exceed 5.5 volts. The threshold voltage $V_T$ of the first and second MOSFETs MN2 and MN3 in a CMOS circuit with a rated supply voltage $V_{DD}$ of 5 volts is approximately 0.8 volts.

Thus, in a practical example of the switch circuit 1 and the open drain driver 7 implemented in a CMOS process with a rated supply voltage $V_{DD}$ of 5 volts, and with the MOSFET switch MN1 switching a high frequency AC analogue signal of 5 volts, which varies peak to peak between +2.5 volts and −2.5 volts, the maximum voltage which would appear on the output node 8 of the open drain driver 7 is 7.5 volts. When the open drain driver 7 is operating in the high impedance state with the second MOSFET MN3 in the non-conducting state, as the voltage on the output node 8 increases, the first MOSFET MN2 conducts current to the coupling node 9 until the voltage on the coupling node 9 reaches a value equal to the supply voltage $V_{DD}$ of 5 volts on the gate of the first MOSFET MN2 less the threshold voltage $V_T$ of 0.8 volts thereof, namely, 4.2 volts, at which stage the first MOSFET MN2 goes into the non-conducting state. Thus, at this stage the drain-source voltage $V_{ds}$ of the second MOSFET MN3 is 4.2 volts, and any further increase in the voltage on the output node 8 of the open drain driver 7 is developed across the first MOSFET MN2. Additionally, as the voltage on the output node 8 increases above 4.2 volts to 7.5 volts, should current leaking through the first MOSFET MN2 cause the voltage on the coupling node 9 to rise to 5.48 volts, the voltage on the coupling node 9 is clamped at 5.48 volts by the diode D1. Furthermore, should the drain-source parasitic capacitance of the first MOSFET MN2 coupling the output node 8 to the coupling node 9 cause the voltage on the coupling node 9 to rise to 5.48 volts, the voltage on the coupling node 9 is similarly clamped at 5.48 volts by the diode D1. Therefore, the maximum value to which the drain-source voltage $V_{ds}$ and the drain-gate voltage $V_{dg}$ of the second MOSFET MN3 can rise is 5.48 volts, which is within the permitted reliability limit of the rated supply voltage of 5 volts plus 10%. With the maximum voltage appearing on the output node 8 of the open drain driver 7 being 7.5 volts, the maximum drain-source voltage $V_{ds}$ to which the first MOSFET MN2 is subjected is 3.3 volts, and the maximum gate-source voltage to which the first MOSFET MN2 is subjected is 0.8 volts, all of which are within the permitted reliability limit of the first MOSFET MN2.

In another practical example of the switch circuit 1 when the switch circuit 1 and the open drain driver 7 are implemented in a CMOS process with a rated supply voltage $V_{DD}$ of 5 volts, the DC voltage component of the input voltage $V_{in}$ applied to the input terminal 3 can change suddenly from 0 volts to 4 volts. Thus, without any AC component in the input voltage $V_{in}$, such a 4 volt change in the input voltage would cause the voltage on the output node 8 to jump instantaneously from 5 volts to 9 volts. The voltage on the output node 8 would then decay slowly back to 5 volts with a time constant based on the capacitance of the capacitor C1, and the resistance of the first pull-up resistor R1. Immediately the voltage on the output node 8 rose to 9 volts, the voltage on the coupling node 9 would be clamped at 4.2 volts by the diode D1, as already described in the last example, and the first MOSFET MN2 would go into the non-conducting state. Thus, in this case, the voltage of 9 volts which would appear on the output node 8 would be divided between the first and second transistors MN2 and MN3, and the voltage across the second transistor MN3 would be 4.2 volts, while the voltage across the first transistor MN2 would be 4.8 volts. Additionally, in this case, should the capacitive coupling of the coupling node 9 to the output node 8 by the drain-source parasitic capacitance of the first MOSFET MN2 after the first MOSFET MN2 has gone into the non-conducting state cause the voltage on the coupling node 9 to rise above 4.2 volts, or should the rate of DC current leakage through the first MOSFET MN2 be greater than the rate of DC current leakage through the second MOSFET MN3, the voltage on the coupling node 9 is clamped by the diode D1 as soon as it reaches 5.48 volts.

In order to avoid the back gate-source voltage $V_{bs}$ of the first and second MOSFETs MN2 and MN3 exceeding the permitted reliability limit of the rated supply voltage $V_{DD}$ plus 10%, the back gates of the first and second MOSFETs MN2 and MN3 are tied to their respective sources, thereby maintaining the back gate-source voltages $V_{bs}$ of the respective first and second MOSFETs MN2 and MN3 at zero volts.

Figure 2:
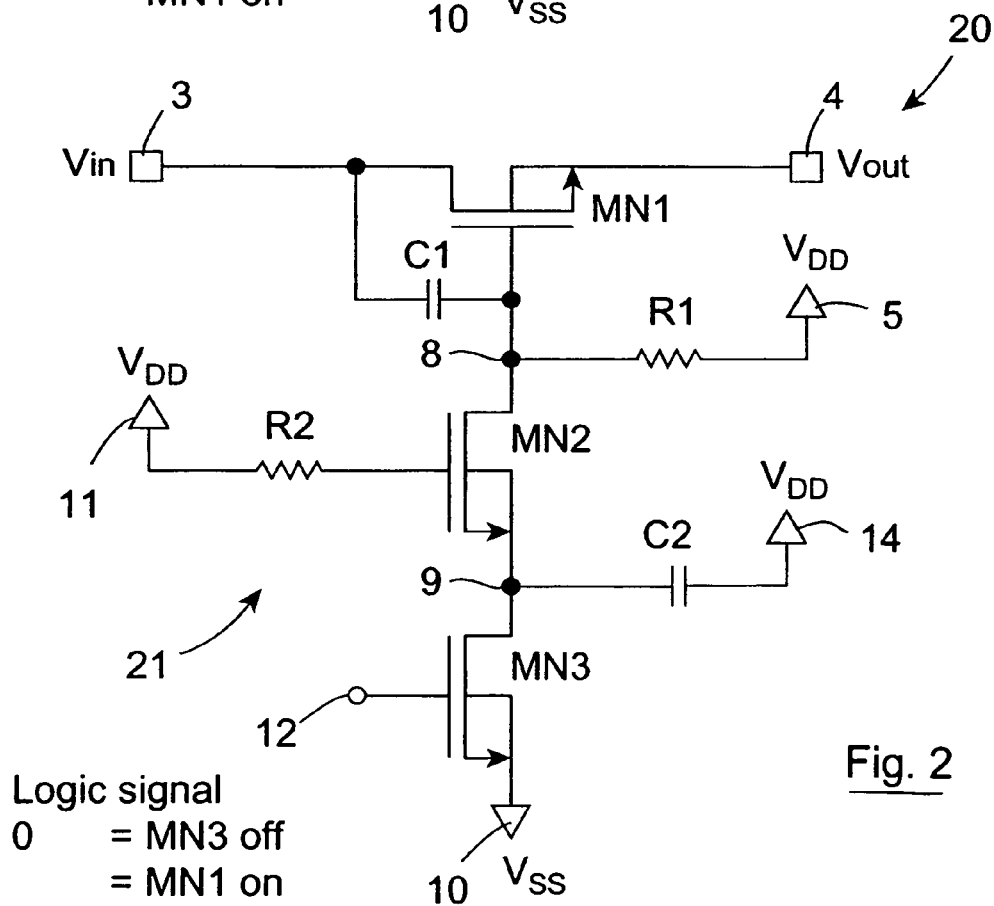
FIG. 2 is a circuit diagram of a switch circuit according to another embodiment of the invention.

Referring now to FIG. 2, there is illustrated a switch circuit also according to the invention, indicated generally by the reference numeral 20, for switching a high frequency AC analogue input signal $V_{in}$. The switch circuit 20 is substantially similar to the switch circuit 1 and similar components are identified by the same reference numerals. The switch circuit 20 is suitable for implementing in a CMOS process, and is particularly suitable for switching high frequency AC analogue input signals, and in particular, analogue video signals of frequency in the range of 27 MHz to 81 MHz. The switch circuit 20 comprises an open drain driver 21 according to another embodiment of the invention, which is substantially similar to the open drain driver 1 of FIG. 1. The main difference between the open drain driver 21 and the open drain driver 7 is that the coupling element which couples the coupling node 9 to the reference voltage node 14 is provided by a capacitive coupling element comprising an N-well coupling capacitor C2 for capacitively coupling the coupling node 9 to the reference voltage node 14, which in this embodiment of the invention is also a low impedance node. The reference voltage which is applied to the reference node 14 is the positive supply voltage $V_{DD}$, which is supplied from a low impedance source.

The coupling capacitor C2 attenuates any voltages, which are capacitively coupled from the output node 8 to the coupling node 9 by the drain-source parasitic capacitance of the first MOSFET MN2, when the first and second MOSFETs MN2 and MN3 are in the non-conducting state. Thus, by appropriately selecting the value of the capacitance of the coupling capacitor C2, when the open drain driver 7 is in the high impedance state, and the first MOSFET MN2 is in the non-conducting state, the coupling capacitor C2 prevents the voltage on the coupling node 9 resulting from voltages which are capacitively coupled from the output node 8 to the coupling node 9 by the drain-source parasitic capacitance of the first MOSFET MN2 rising above the permitted reliability limit of the second MOSFET MN3.

The capacitance of the coupling capacitor C2 should be selected so that the ratio of the drain-source parasitic capacitance of the first MOSFET MN2 to the sum of the capacitance of the coupling capacitor C2 and the parasitic capacitances of the first and second MOSFETs MN2 and MN3, which couple the coupling node 9 to low impedance nodes is sufficiently small to provide the appropriate level of attenuation of the maximum voltage expected on the output node 8 when the maximum voltage is capacitively coupled to the coupling node 9 by the drain-source parasitic capacitance of the first MOSFET MN2. Since the coupling node 9 is capacitively coupled to the switch voltage node 10 and the control node 12 through the parasitic capacitances of the second MOSFET MN3, and to the bias voltage node 11 and the output node 8 by the parasitic capacitances of the first MOSFET MN2, the ratio of the drain-source parasitic capacitance of the first MOSFET MN2 to the sum of the capacitance of the coupling capacitor C2 and the parasitic capacitances of the drain-source and the gate-drain of the second MOSFET MN3 and the drain-source and the gate-source of the first MOSFET MN2 should be sufficiently small to provide the appropriate level of attenuation of the voltages capacitively coupled to the coupling node 9.

Thus, the voltage on the coupling node 9 as a result of the attenuating effect of the coupling capacitor C2 on the voltage which is capacitively coupled from the output node 8 by the drain-source parasitic capacitance of the first MOSFET MN2 is approximately given by the following equation 1:

$$V_9 = V_{9dc} + V_{8ac}\left[\frac{C_{dsMN2}}{C2 + C_{MN2} + C_{MN3}}\right] \quad (1)$$

where $V_9$ is the sum of the DC and AC voltages on the coupling node 9, $V_{9dC}$ is the DC voltage on the coupling node 9, $V_{8ac}$ is the AC voltage on the output node 8, $C_{dsMN2}$ is the drain-source parasitic capacitance of the first MOSFET MN2, C2 is the capacitance of the coupling capacitor C2, $C_{MN2}$ is the sum of the parasitic capacitances of the first MOSFET MN2 coupling the coupling node 9 to the low impedance nodes, namely, the output node 8 and the bias voltage node 11, and $C_{MN3}$ is the sum of the parasitic capacitances of the second MOSFET MN3 coupling the coupling node 9 to the low impedance nodes, namely, the switching voltage node 10 and the control node 12.

Where the parasitic capacitances of the first MOSFET MN2 and the second MOSFET MN3 are similar, in general, by providing the coupling capacitor C2 with a capacitance value of approximately twice the drain-source parasitic capacitance of the first MOSFET MN2, a sufficient level of attenuation is obtained.

In a typical CMOS circuit with a rated supply voltage of 5 volts, in which the open drain driver 21 according to this embodiment of the invention is implemented, the drain-source parasitic capacitance of the first and second MOSFETs MN2 and MN3 are each approximately 20 fF. Thus, by selecting the coupling capacitor C2 to have a capacitance of the order of 40 fF, an adequate level of attenuation of the voltage, which is capacitively coupled to the coupling node 9 from the output node 8 is achieved. Additionally, the capacitance of the coupling capacitor C2 is chosen to be significantly less than the capacitance of the capacitor C1 in order to minimise attenuation of the input signal $V_{in}$ applied to the main input terminal 3, when the open drain driver 21 is in the high impedance state, and the first MOSFET MN2 is in the conducting state. Typically, the capacitor C1 would be of capacitance of the order of 40 pF, and thus, with a capacitance of 40 fF, the capacitance of the coupling capacitor C2 is significantly less than the capacitance of the capacitor C1.

Thus, when the open drain driver 21 of the switch circuit 20 is operating with the first and second MOSFETs MN2 and MN3 in the non-conducting state, voltages on the gate of the MOSFET switch MN1 which are capacitively coupled through the drain-source parasitic capacitance of the first MOSFET MN2 to the coupling node 9 are in turn attenuated by the AC coupling capacitor C2 which capacitively couples the coupling node 9 to the reference voltage node 14, thereby preventing the voltage on the coupling node 9 exceeding the permitted reliability limit of the second MOSFET MN3. Because the capacitance of the coupling capacitor C2 is significantly less than the capacitance of the capacitor C1, any attenuating effect of the coupling capacitor C2 on the input signal $V_{in}$ on the main input terminal 3 when the open drain driver 21 is in the high impedance state is minimal, irrespective of whether the first MOSFET MN2 is in the conducting state or the non-conducting state. Thus, the open drain driver 21 has little or no effect on the input signal being switched by the MOSFET switch MN1 when the open drain driver 21 is in the high impedance state.

Figure 3:
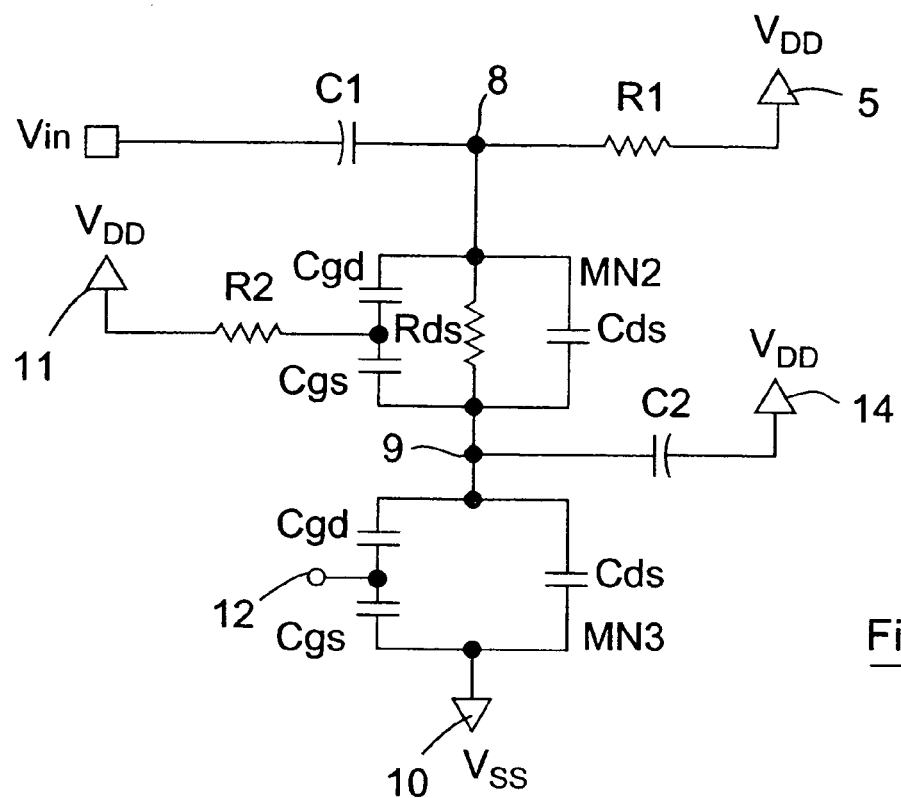
FIG. 3 is a capacitance equivalent circuit of the switch circuit of FIG. 2.

Referring now to FIG. 3, there is illustrated a simplistic capacitance equivalent circuit representation of the open drain driver 21 of the switch circuit 20 showing the parasitic capacitances of the first and second MOSFETs MN2 and MN3 when the first and second MOSFETs MN2 and MN3 are both in the non-conducting state. As can be seen, there is no path for DC currents to flow from the source of the first MOSFET MN2 or the drain of the second MOSFET MN3. Accordingly, the DC voltage on the coupling node 9 will be equal to its voltage when the first MOSFET MN2 went from the conducting state to the non-conducting state plus any increase in voltage resulting in DC current leakage through the drain-source off-resistance of the first MOSFET MN2, which is not conducted to the switching voltage node 10 through the drain-source off-resistance of the second MOSFET MN3. The AC current of the input signal $V_{in}$ flows through the capacitor C1 into the first MOSFET MN2, and when the first MOSFET MN2 is in the non-conducting state, and depending on the frequency of the AC input signal $V_{in}$ the AC current will be divided between three paths through the first MOSFET 2, namely, the path which includes the gate-source capacitance and gate-drain parasitic capacitance, namely, $C_{gs}$ and $C_{gd}$, the path which includes the drain-source parasitic capacitance $C_{ds}$, and the path which includes the drain-source off-resistance $R_{ds}$ of the first MOSFET MN2. The paths through which the AC current flows through the first MOSFET MN2 are also dependent on the impedance which each of these paths present to the AC current of the AC input signal $V_{in}$. Provided the capacitance of the coupling capacitor C2 is sufficiently large, and preferably twice the value of the parasitic capacitance of the first MOSFET MN2, which capacitively couples the coupling node 9 to the output node 8, the coupling capacitor C2 along with the parasitic capacitances which couple the coupling node 9 to the low impedance nodes 10, 11 and 12 and the output node 8, provides a capacitive divider with the parasitic capacitances of the first MOSFET MN2, which couple the coupling node 9 to the output node 8, which is sufficient for adequately attenuating any typical expected AC voltage or other voltage on the coupling node 9 capacitively coupled from the output node 8. Low frequency input signals which may be coupled to the main input terminal 3 of the switch circuit 20 may be ignored, provided the capacitor C1 and the first pull-up resistor R1 are appropriately sized to provide a high pass filter to the input signal, and thus low frequency input signals would not be coupled into the drain of the first MOSFET MN2 by the capacitor C1.

The switch circuit 20 is particularly suitable for low voltage CMOS circuits, for example, CMOS circuits with a rated supply voltage $V_{DD}$ of 1.8 volts, where the problem of overvoltages result largely from AC voltage signals or sudden surges in the voltage on the output node 8. In such low voltage CMOS circuits, the open drain driver 7 of the switch circuit 1 described with reference to FIG. 1 is not particularly suitable, since, in general, it is not possible to provide a diode with a lower conducting voltage than approximately 0.44 volts. Thus, if the open drain driver 7 were implemented in a CMOS circuit with a rated supply voltage $V_{DD}$ of 1.8 volts, and if the voltage applied to the reference voltage node 14 were the supply voltage $V_{DD}$ of 1.8 volts, the voltage on the coupling node 9 would not be clamped until it reached 2.24 volts, which would be greater than the permitted reliability limit of $V_{DD}$ plus 10%. Therefore, unless the reference voltage node 14 were held at a voltage below the supply voltage $V_{DD}$, namely, at a voltage of approximately 1.98 volts, the drain-source voltage across the second MOSFET MN3 would exceed the permitted reliability limit in a 1.8 rated operating voltage CMOS circuit.

Figure 4:
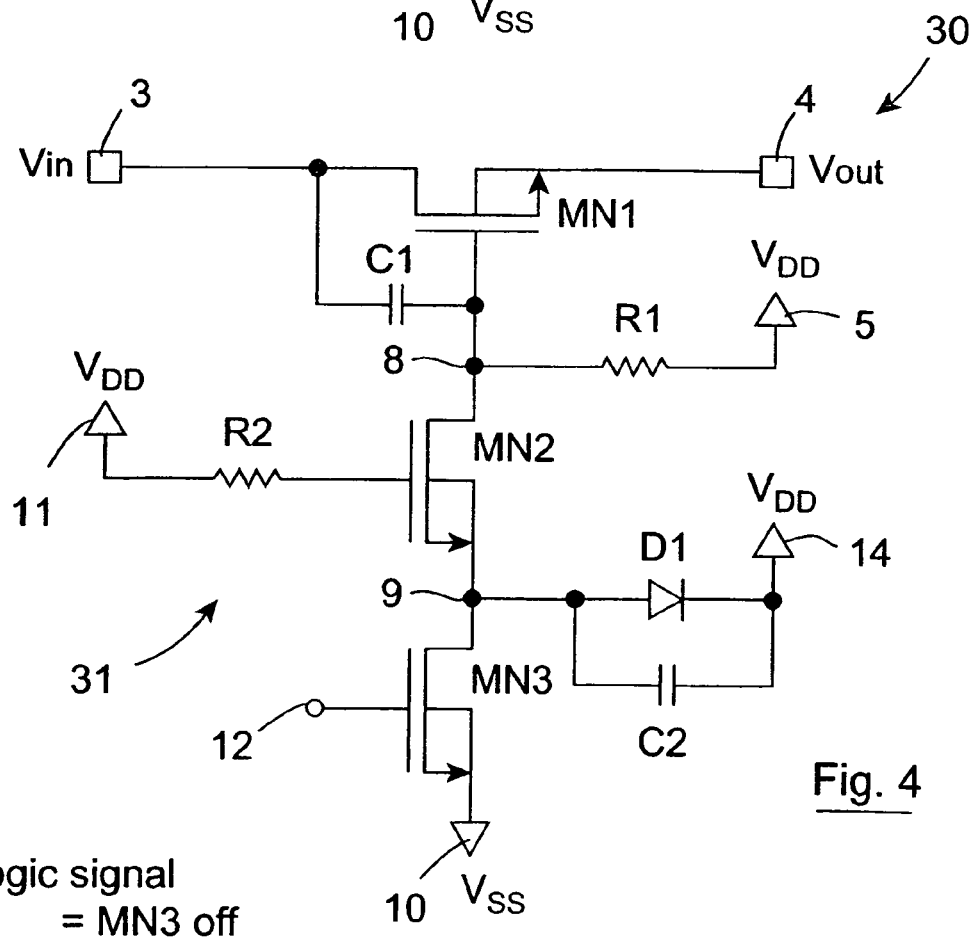
FIG. 4 is a circuit diagram of a switch circuit according to another embodiment of the invention.

Referring now to FIG. 4, there is illustrated a switch circuit according to another embodiment of the invention, which is indicated generally by the reference numeral 30, and which is also suitable for switching high frequency AC analogue input signals. The switch circuit 30 is substantially similar to the switch circuit 1, and similar components are identified by the same reference numerals. The switch circuit 30 comprises an open drain driver 31 according to another embodiment of the invention, which is substantially similar to the open drain driver 7 of FIG. 1. The main difference between the open drain driver 31 and the open drain driver 7 is that the coupling element for coupling the coupling node 9 to the reference voltage node 14 for limiting the voltage on the coupling node 9 comprises both a DC coupling element, and a capacitive coupling element. The DC coupling element is provided by a diode D1, which is similar to the diode D1 of the open drain driver 7 of the switch circuit 1 of FIG. 1, and the capacitive coupling element is provided by a coupling capacitor C2, which is provided by an N-well capacitor, and is similar to the coupling capacitor C2 of the open drain driver 21 of the switch circuit 20 of FIG. 2. The reference node 14 is a low impedance node to which the positive supply voltage $V_{DD}$ is applied.

Otherwise, the switch circuit 30 is similar to the switch circuit 1.

The advantage of the switch circuit 30 over and above the switch circuits 1 and 20 is that when the first and second MOSFETs MN2 and MN3 are in the non-conducting state, the diode D1 clamps the DC voltage level on the coupling node 9 at the voltage on the reference voltage node 14 plus the conducting voltage of the diode D1, which in this case is $V_{DD}$ plus 0.48 volts, while the coupling capacitor C2 attenuates any AC voltages or voltage surges which are capacitively coupled onto the coupling node 9 from the output node 8, as discussed with reference to the open drain driver 21 of FIG. 2.

Figure 5:
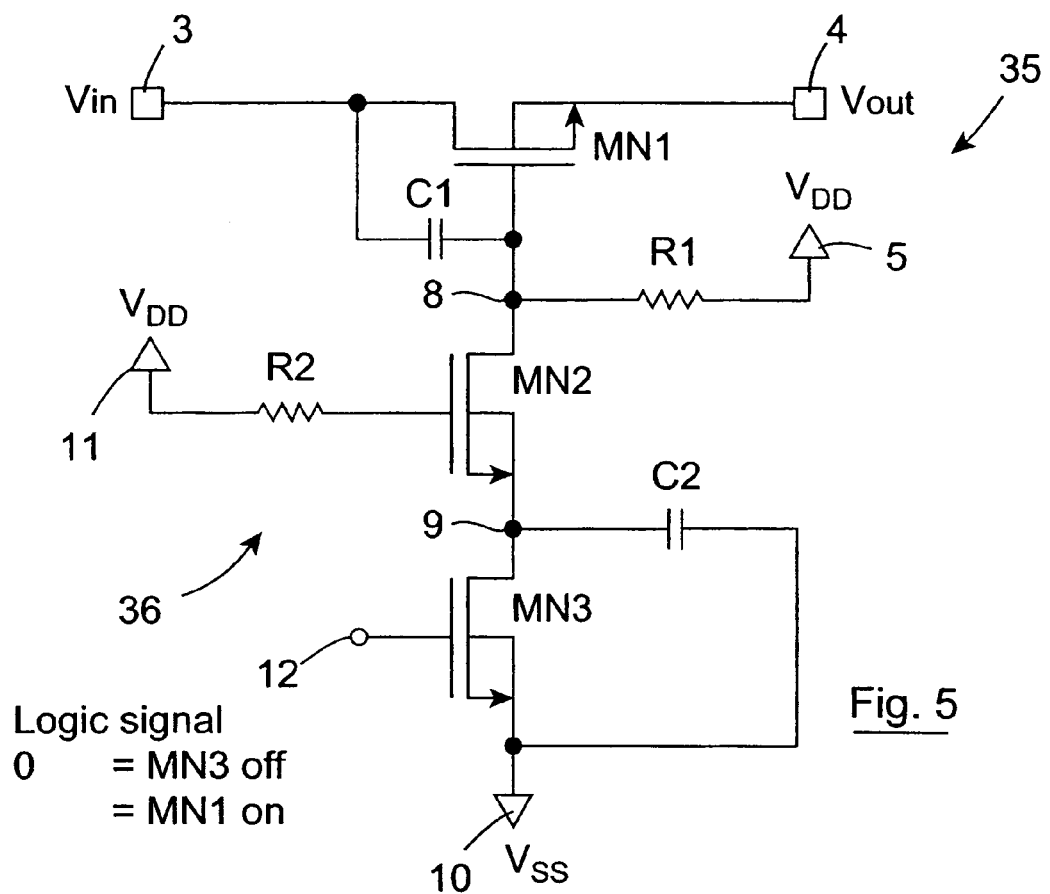
FIG. 5 is circuit diagram of a switch circuit according to a further embodiment of the invention.

Referring now to FIG. 5, there is illustrated a switch circuit according to a further embodiment of the invention, indicated generally by the reference numeral 35. The switch circuit 35 is substantially similar to the switch circuit 1, and similar components are identified by the same reference numerals. The switch circuit 35 is also particularly suitable for implementing in a CMOS process, and comprises an open drain driver 36, which is substantially similar to the open drain driver 21 of the switch circuit 20. The main difference between the switch circuit 35 and the switch circuits 1 and 20 is in the open drain driver 36. In this embodiment of the invention the coupling node 9 is capacitively coupled by the coupling capacitor C2 to the switching voltage node 10, which is also a low impedance node. Since the switching voltage node 10 is also a low impedance node, Equation 1, which gives the voltage $V_9$ on the coupling node 9 holds for the open drain driver circuit 36 in the same manner as Equation 1 holds for the voltage $V_9$ on the coupling node 9 of the open drain driver 21, and operation of the switch circuit 35 according to this embodiment of the invention and the open drain driver 36 also according to this embodiment of the invention is similar to that described with reference to the switch circuit 20 and the open drain driver 21 described with reference to FIGS. 2 and 3.

Figure 6:
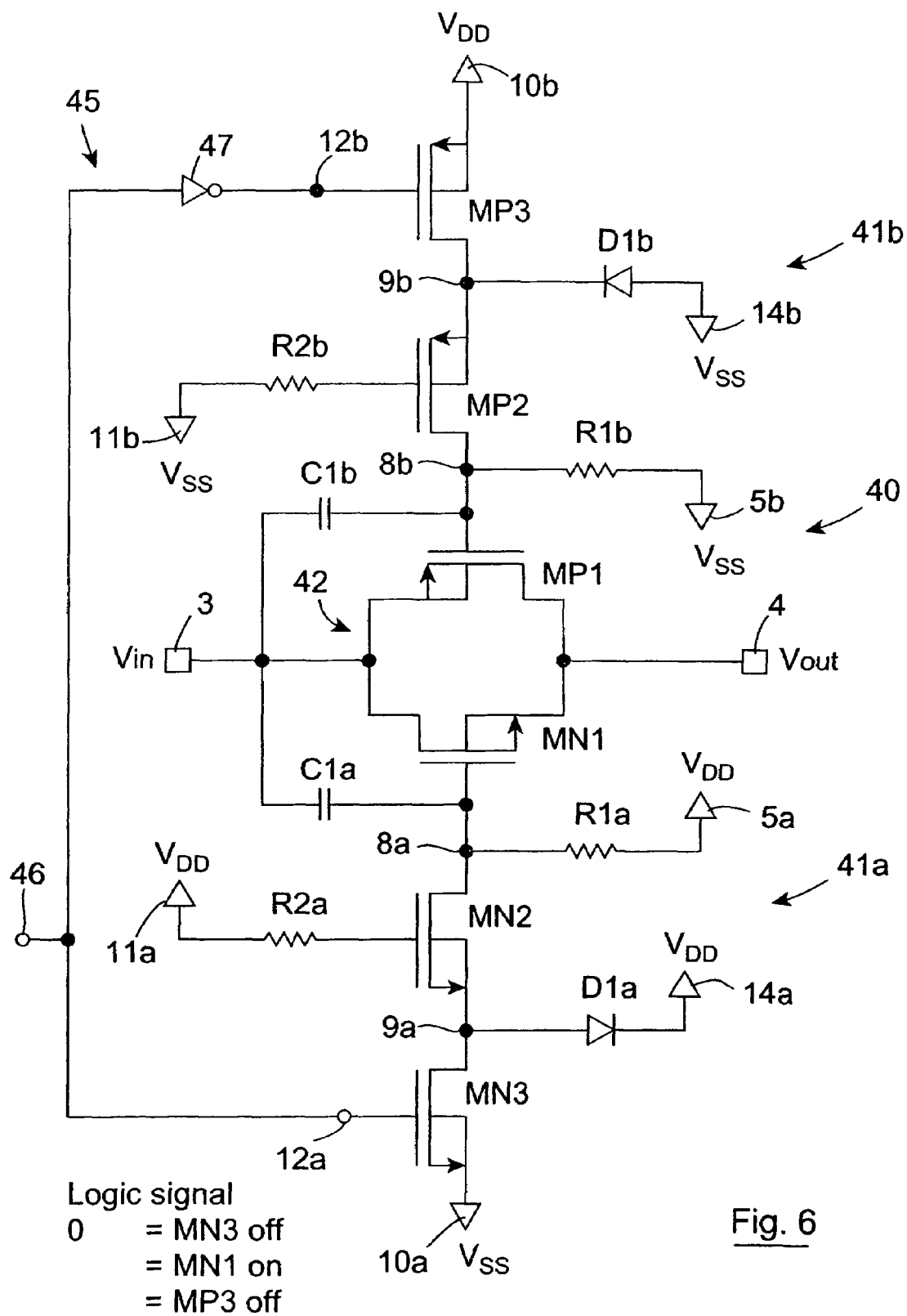
FIG. 6 is a circuit diagram of a switch circuit according to a still further embodiment of the invention.

Referring now to FIG. 6, there is illustrated a switch circuit according to a further embodiment of the invention, indicated generally by the reference numeral 40. The switch circuit 40 is substantially similar to the switch circuit 1 and similar components are identified by the same reference numerals. The main difference between the switch circuit 40 and the switch circuit 1 of FIG. 1 is that the transistor switch, instead of being provided by a single N-channel MOSFET switch, is provided by a switching circuit, which in this embodiment of the invention is a CMOS switch 42, which comprises a first N-channel MOSFET switch MN1, which is similar to the N-channel MOSFET switch MN1 of the switch circuit 1, and a second P-channel MOSFET switch MP1 arranged in parallel between the main input terminal 3 and the main output terminal 4. The respective gates of the first and second MOSFET switches MN1 and MP1 are AC coupled to the input terminal 3 for AC coupling the AC input signal to the gates of the first and second MOSFET switches MN1 and MP1 in similar fashion to that already described with reference to the switch circuit 1 of FIG. 1.

The first MOSFET switch MN1 is coupled to a first control voltage terminal 5a through a first pull-up resistor R1a, which is similar to the pull-up resistor R1 of the switch circuit 1 of FIG. 1. The positive supply voltage $V_{DD}$ is applied to the first control voltage terminal 5a for passively holding the first MOSFET switch MN1 in the conducting state. However, the gate of the second MOSFET switch MP1 is coupled to a second control voltage terminal 5b through a pull-down resistor R1b. The negative supply voltage $V_{ss}$ is applied to the second control voltage terminal 5b for passively holding the second MOSFET switch MP1 in the conducting state. A first open drain driver 41a is coupled to the gate of the first MOSFET switch MN1 for selectively pulling the first MOSFET switch MN1 to a first switching voltage, namely, the negative supply voltage $V_{ss}$ on a first switching voltage node 10a, for operating the first MOSFET switch MN1 in the non-conducting state. The first open drain driver 41a is similar to the open drain driver 7 of FIG. 1, and similar components are identified by the same reference numerals.

A second open drain driver 41b according to another embodiment of the invention is provided for selectively pulling the gate of the second MOSFET switch MP1 to a second switching voltage, namely, the positive supply voltage $V_{DD}$, which is applied to a second switching voltage node 10b, in order to operate the second MOSFET switch MP1 in the non-conducting state. The second open drain driver 41b is substantially similar to the open drain driver 7 of the switch circuit 1, and similar components are identified by the same reference numerals. However, for convenience, in order to distinguish the second open drain driver 41b from the first open drain driver 41a, the reference numerals relevant to the first open drain driver 41a terminate in the letter "a", while those relevant to the second open drain driver 41b terminate in the letter "b".

In the second open drain driver 41b the first and second MOSFETs are P-channel first and second MOSFETs MP2 and MP3, respectively. The first and second MOSFETs MP2 and MP3 are coupled in series between the gate of the second MOSFET switch MP1 and the second switching voltage node 10b in similar fashion as the first and second MOSFETs MN2 and MN3 of the first open drain driver 41a are coupled in series between the gate of the first MOSFET switch MN1 and the first switching voltage node 10a. The gate of the first MOSFET MP2 is coupled to a first bias voltage node 11b of the second open drain driver 41b through a pull-down resistor R2b, and a second bias voltage, in this case the negative supply voltage $V_{ss}$ is applied to the first bias voltage node 11b for holding the first MOSFET MP2 in the conducting state.

The coupling node 9b is coupled to a second reference voltage node 14b of the second open drain driver 41b by a diode D1b, which is similar to the diode D1 of the open drain driver 7 of the switch circuit 1 of FIG. 1. A second reference voltage, in this case the negative supply voltage $V_{ss}$ is applied to the second reference voltage node 14b for limiting the current on the coupling node 9b. The diode D1b is coupled between the coupling node 9b and the second reference voltage node 14b for clamping the voltage on the coupling node 9b at a negative voltage value equal to the negative supply voltage $V_{ss}$ less the conducting voltage of the diode D1b. In other words, the voltage on the coupling node 9b will be clamped at a voltage of the value of the conducting voltage of the diode D1b below the negative supply voltage $V_{ss}$.

A control circuit 45 for applying the logic control signal to the control node 12a and 12b of the first and second open drain drivers 41a and 41b, respectively, comprises a main control terminal 46 to which the logic control signal is applied. The logic control signal is applied directly from the main control terminal 46 to the control node 12a of the first open drain driver 41a, and the control logic signal is applied from the main control terminal 46 through an inverter 47 to the control node 12b of the second open drain driver 41b, so that the first and second MOSFET switches MN1 and MP1 are simultaneously operated in the same state.

In use, the CMOS switch 42 is passively held in the conducting state by the first MOSFET switch MN1 being passively held in the conducting state by the positive supply voltage $V_{DD}$ on the first control voltage terminal 5a, and by the second MOSFET switch MP1 being passively held in the conducting state by the negative supply voltage $V_{ss}$ on the second control voltage terminal 5b, when the logic control signal on the main control terminal 46 is at logic low. In this state the CMOS switch 42 switches the input signal $V_{in}$ on the main input terminal 3 to the main output terminal 4. When it is desired to operate the CMOS switch 42 in the non-conducting state for isolating the main output terminal 4 from the main input terminal 3, the control logic signal is put to logic high, which operates the second MOSFETs MN3 and MP3 of the first and second open drain drivers 41a and 41b, respectively, in the conducting state, and thus the gates of the first and second MOSFET switches MN1 and MP1 are pulled to the first and second switching voltages, namely, the negative supply voltage $V_{ss}$ and the positive supply voltage $V_{DD}$, respectively, on the first and second switching voltage nodes 10a and 10b, for simultaneously operating the first and second MOSFET switches MN1 and MP1 in the non-conducting state.

The operation of the first open drain driver 41a for protecting the first and second MOSFETs MN2 and MN3 as the voltage on the output node 8 of the first open drain driver 41a rises is similar to that already described with reference to the open drain driver 7 of FIG. 1.

The operation of the second open drain driver 41b for protecting the first and second MOSFETs MP2 and MP3 as the voltage on the output node 8b of the second open drain driver 41b falls is as follows. The first MOSFET MP2 conducts until the value of the voltage on the coupling node 9b drops to a value equal to the difference between the negative supply voltage $V_{ss}$ on the gate of the first MOSFET MP2 and the threshold voltage of the first MOSFET MP2, at which stage the first MOSFET MP2 goes into the non-conducting state. Any further drop in the voltage on the output node 8b of the second open drain driver 41b is developed across the drain and source of the first MOSFET MP2.

Should the voltage on the coupling node 9b fall further than the difference between the voltage $V_{ss}$ on the gate of the first MOSFET MP2 and the threshold voltage of the first MOSFET MP2, due to leakage through the first MOSFET MP2 or capacitive coupling of the voltage on the output node 8b to the coupling node 9b, the voltage on the coupling node 9b is clamped by the diode D1b when the voltage on the coupling node 9b drops to a voltage value equal to the sum of the numerical values of the negative supply voltage $V_{ss}$ on the second reference voltage node 14b and the conducting voltage of the diode D1b, ignoring the signs of the voltages. Accordingly, the second open drain driver 41b operates to protect the first and second MOSFETs MP2 and MP3 from over-voltages in similar fashion as the first open drain driver 41a operates to protect the first and second MOSFETs MN2 and MN3 of the first open drain driver 41a.

Figure 7:
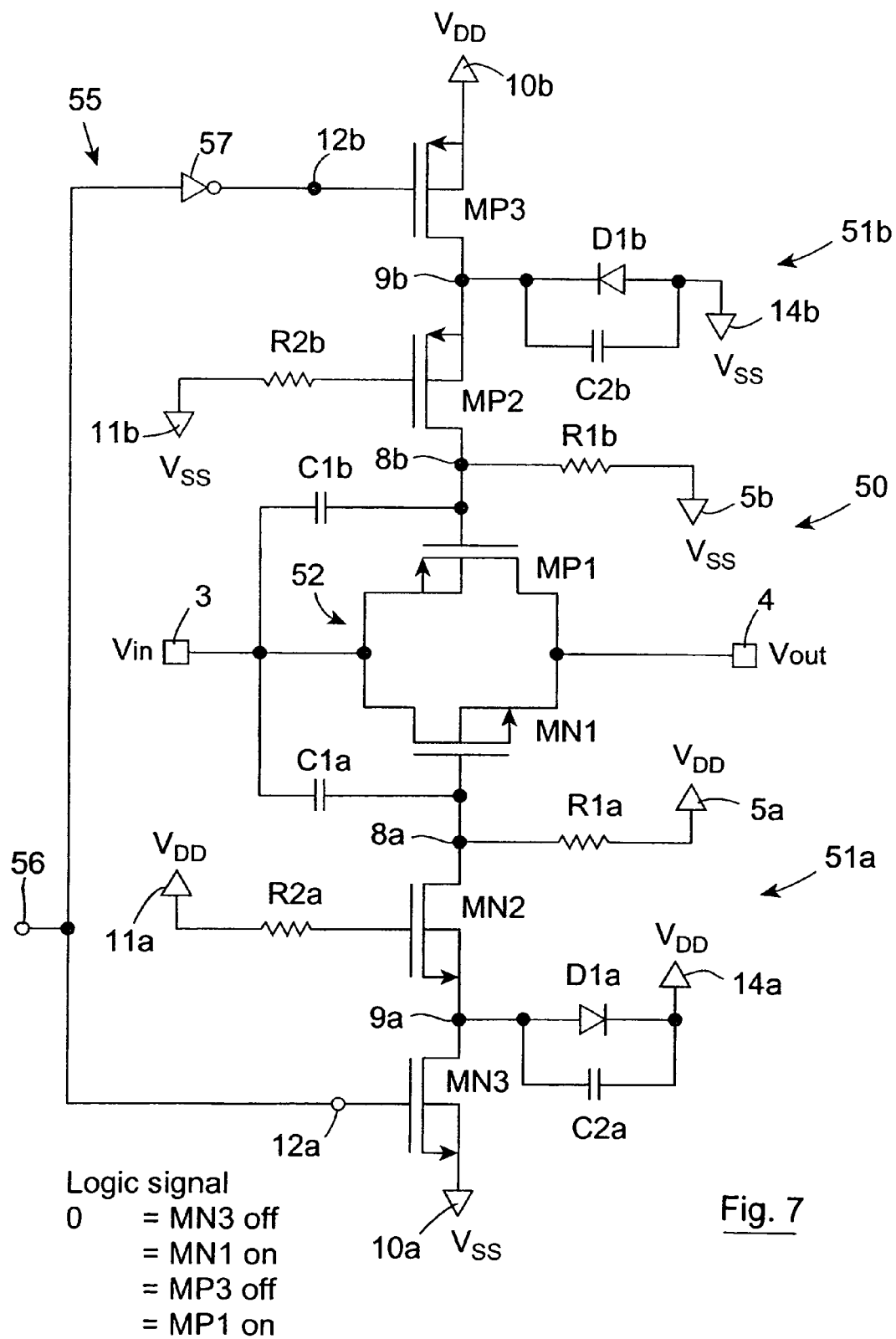
FIG. 7 is a circuit diagram of a switch circuit according to a further embodiment of the invention.

Referring now to FIG. 7, there is illustrated a switch circuit according to another embodiment of the invention, which is indicated generally by the reference numeral 50. The switch circuit 50 is substantially similar to the switch circuit 40, and similar components are identified by the same reference numerals. The transistor switch is provided by a CMOS switch 52 comprising first and second MOSFET switches, namely, an N-channel first MOSFET switch MN1 and a P-channel second MOSFET switch MP1, which are similar to those of the switch circuit 40 of FIG. 6. First and second open drain drivers 51a and 51b, which are also according to the invention, are provided for selectively pulling the gates of the respective first and second MOSFET switches MN1 and MP1 to the first and second switching voltages, namely, the negative supply voltage $V_{ss}$ and the positive supply voltage $V_{DD}$, respectively, on the first and second switching voltage nodes 10a and 10b, for operating the first and second MOSFET switches MN1 and MP1 in the non-conducting state.

The first and second open drain drivers 51a and 51b are substantially similar to the open drain drivers 41a and 41b of FIG. 6, with the exception that the coupling element for coupling the respective coupling nodes 9a and 9b of the first and second open drain drivers 51a and 51b to the corresponding first and second reference voltage nodes 14a and 14b as well as comprising diodes D1 and D2 for DC coupling the corresponding coupling nodes 9a and 9b to the first and second reference voltage nodes 14a and 14b, respectively, also include capacitively coupling elements comprising coupling capacitors C2a and C2b for capacitively coupling the corresponding coupling nodes 9a and 9b to the corresponding first and second reference voltage nodes 14a and 14b, respectively. Accordingly, in this embodiment of the invention the first open drain driver 51a is similar to the open drain driver 31 of the switch circuit 30 described with reference to FIG. 4, and the second open drain driver 51b is similar to the open drain driver 31 of FIG. 4, with the exception that the first and second MOSFETs are P-channel first and second MOSFETs MP2 and MP3, and thus the second bias voltage and the second reference voltage are provided by the negative supply voltage $V_{ss}$. Accordingly, the first and second open drain drivers 51a and 51b operate in a similar fashion to that of the open drain driver 31 of FIG. 4, and the coupling nodes 9a and 9b are DC coupled and capacitively coupled to the first and second reference voltage nodes 14a and 14b, respectively, and thereafter the operation of the switch circuit 50 and the first and second open drivers 51a and 51b is similar to that of the switch circuit 40 and the first and second open drain drivers 41a and 41b described with reference to FIG. 5.

Figure 8:
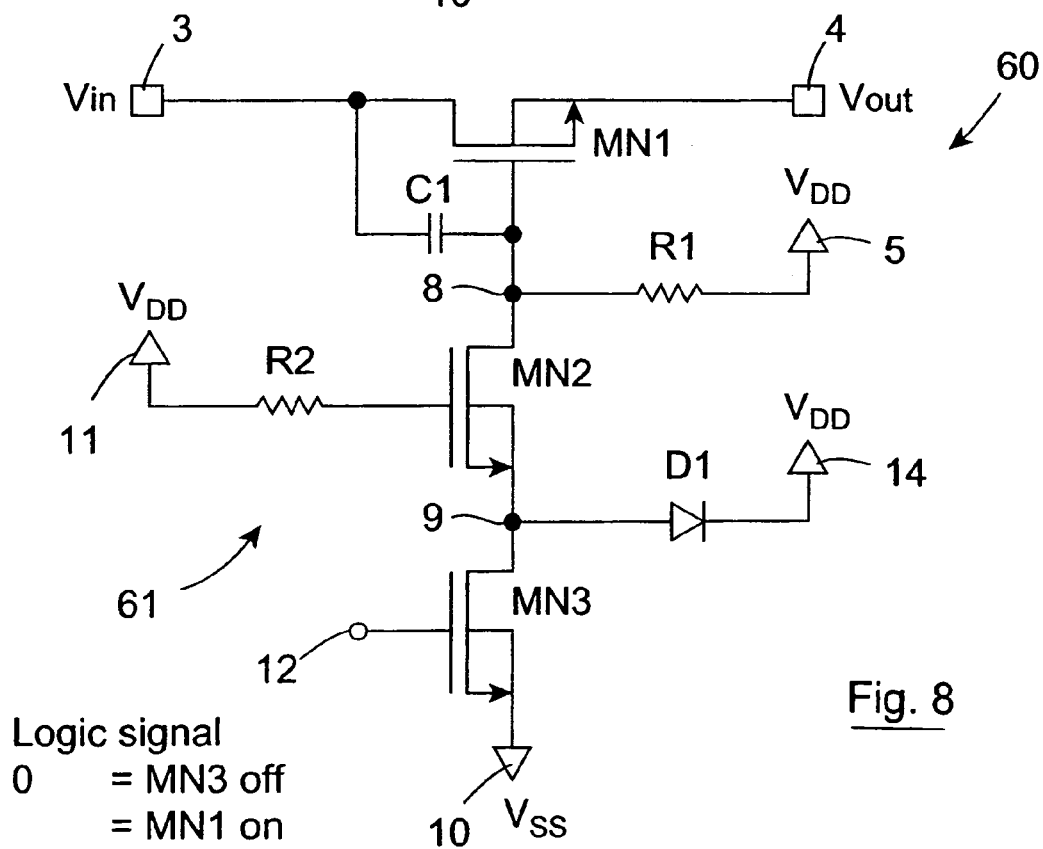
FIG. 8 is a circuit diagram of a switch circuit according to a still further embodiment of the invention.

Referring now to FIG. 8, there is illustrated a switch circuit 60 also according to the invention, which comprises an open drain driver 61, which is also according to the invention. The switch circuit 60 is substantially similar to the switch circuit 1 of FIG. 1, and similar components are identified by the same reference numerals. The main difference between the switch circuit 60 and the switch circuit 1 is in the open drain driver 61. In the open drain driver 61 the coupling node 9 is DC coupled to the reference voltage node 14 through the diode D1 for clamping the DC voltage on the coupling node 9 as in the open drain driver 7 of the switch circuit 1. However, additionally, in the open drain driver 61 the second MOSFET MN3 is sized relative to the first MOSFET MN2 so that the parasitic capacitance of the second MOSFET MN3 which couples the coupling node 9 to the switching voltage node 10 and the control node 12 is sufficiently greater than the drain-source parasitic capacitance of the first MOSFET MN2 which capacitively couples the coupling node 9 to the output node 8. Since both the switching voltage node 10 and the control node 12 are low impedance nodes, by sizing of the second MOSFET MN3 relative to the first MOSFET MN2 to provide sufficient capacitive coupling of the coupling node 9 to the two low impedance nodes, namely, the switching voltage node 10 and the control voltage node 12, sufficient attenuation of the voltage on the coupling node 9, which is capacitively coupled from the output node 8 by the drain-source parasitic capacitance of the first MOSFET MN2 is achieved, in order to prevent the capacitively coupled voltage on the coupling node 9 rising above the reliability limit of the second MOSFET MN3.

The switch circuits according to the invention have many uses, for example, the switch circuits according to the invention may be used as the switches in a multiplexer for multiplexing a plurality of high frequency AC analogue signals to a signal processing circuit, and in particular, the switch circuits according to the invention may be used as the switches in a multiplexer for multiplexing a plurality of analogue video signals of frequency in the range of 27 MHz to 81 MHz sequentially to a video signal processing circuit. By virtue of the fact that the distortion caused by the switch circuits according to the invention is low due to the removal of variability of switch resistance, the switch circuits are particularly suitable as switches in a multiplexer for multiplexing analogue video signals.

The open drain drivers according to the invention also have many uses besides their use in the switch circuits according to the invention. For example, it is envisaged that the open drain drivers according to the invention may be used as output devices for driving, for example, a low output signal from a low voltage circuit to a higher voltage circuit. A classic application of any of the open drain drivers according to the invention would be as a logic (digital) output device which could only drive low, and the high output would be achieved by putting the open drain driver in the non-conducting state. The logic high level would be provided by an external pull-up resistor which would be coupled to an external supply voltage, which in general, would exceed the rated supply voltage of the integrated circuit containing the open drain driver. For example, any of the open drain drivers according to the invention could be used as an i2c driver in a 1.8 volt rated CMOS circuit for driving an i2c input in a neighbouring 3 volt or 5 volt rated circuit without damage when the open drain driver is in the high impedance state. That is, if the open drain driver according to the invention is provided with a capacitive coupling element for coupling the coupling node between the first and second MOSFETs to the reference voltage node or another low impedance node, and/or if the coupling element is provided by a DC coupling diode, and the bias voltage and the reference voltage which are applied to the bias voltage node, and the reference voltage node, respectively, are appropriately selected.

While the bias voltage node and the reference voltage node of the open drain drivers comprising N-channel first and second MOSFETs MN2 and MN3 have been described as being held at the positive supply voltage $V_{DD}$, it will be readily apparent to those skilled in the art that the bias voltage node and reference voltage node may be held at any desired voltage, and indeed, the voltage at which the bias voltage node is held may be greater or lower than the positive supply voltage $V_{DD}$, and the voltages at which the bias voltage node and the reference voltage node are held may be the same or different. The lower the voltage at which the bias voltage node is held, the lower the voltage will be on the coupling node before the first MOSFET MN2 goes into the non-conducting state, and similarly, the higher the voltage at which the bias voltage node is held, the higher the voltage will be on the coupling node before the first MOSFET MN2 goes into the non-conducting state. It is envisaged that the voltage at which the reference voltage node is held may be lower than the supply voltage, in order to lower the voltage at which the voltage on the coupling node is clamped. It is also envisaged that the first control node may be held at any suitable voltage for passively holding the MOSFET switch MN1 in the conducting state.

Similarly, the voltages at which the bias voltage node and the reference voltage node of the open drain drivers which comprise P-channel first and second MOSFETs MP2 and MP3 may be other than the negative supply voltage $V_{ss}$, and the voltages at which the bias voltage node and reference voltage node would be held would be determined by the voltage on the coupling node at which the first MOSFET MP2 is to go into the non-conducting state, and the voltage at which the voltage on the coupling node is to be clamped. Similarly, the voltage at which the second control voltage node is held may be other than the negative supply voltage $V_{ss}$, and may be any suitable voltage for passively holding the second MOSFET switch MP1 in the conducting state.

Needless to say, the switching voltage nodes may be held at voltages other than the positive and negative supply voltages described with reference to FIGS. 6 and 7, and the switching voltage nodes may be held at any voltages which are suitable for operating the corresponding MOSFET switch in the non-conducting state.

While the open drain drivers according to the invention have been described as operating the MOSFET switch in the non-conducting state, it is envisaged in certain cases that the open drain drivers may be arranged for operating the MOSFET switch of the switch circuit in the conducting state, and in which case, the MOSFET switch would be passively held in the non-conducting state.

While the coupling capacitor for capacitively coupling the coupling node to the reference voltage node has been described as being of a specific capacitance value, the coupling capacitor may be provided of any other suitable value. It will also be appreciated that while the diode coupling the coupling node to the reference voltage node of the open drain drivers has been described as having a conducting voltage of 0.48 volts, it will be appreciated that the conducting voltage of the diode may be greater or lesser than 0.48 volts, depending on the particular process by which the circuit of the open drain driver is implemented.

While the open drain drivers according to the invention and the switch circuits according to the invention have been described as being implemented in CMOS processes of rated supply voltages of 5 volts and 1.8 volts, it will be readily apparent to those skilled in the art that the open drain driver and the switch circuit may be implemented in any other CMOS process, for example, a 3.3 volt process, and indeed, it is envisaged that the open drain driver and the switch circuit may be implemented in processes other than CMOS processes.

While the transistors of the open drain drivers which have been described have been described as being MOSFETs, the open drain drivers may be provided with any suitable type of transistors, and the type of transistor will largely be determined by the process by which the open drain driver circuit is implemented.

While the open drain drivers according to the invention have been described as comprising a first transistor and a second transistor arranged in series between the open drain driver output and the switching voltage node, it is envisaged that the open drain drivers according to the invention may include more than two transistors coupled in series between the output node of the open drain driver and the switching voltage node. By providing more than two transistors in series between the output node of the open drain driver and the switching voltage node, the over-voltage applied to the output node of the open drain driver would be divided over all the transistors in series between the output node and the switching voltage node. Where more than two transistors are provided in series between the output node of the open drain driver and the switching voltage node, in general, the transistor which is directly coupled to the switching voltage node would have its gate coupled to the control signal for operating the open drain driver between the high impedance state and the conducting state, and the gates of the other transistors would be biased by appropriate bias voltages, which typically, would be cascaded, the highest bias voltage ignoring the sign of the bias voltage would be applied to the gate of the transistor which is directly coupled to the output node of the open drain driver, and the bias voltage values applied to the gates of the other transistors would cascade downwardly from the value of the bias voltage applied to the gate of the transistor, the drain of which is directly coupled to the output node of the open drain driver. The coupling nodes coupling the sources of the respective transistors to the drain of the next of the transistors would then each be DC coupled to an appropriate reference voltage node, and the reference voltages applied to the respective reference voltage nodes would be different, and would be cascaded downwardly from the transistor coupled directly to the output node of the open drain driver. Additionally or alternatively, the coupling nodes coupling the sources of the respective transistors to the drain of the next one of the transistors would each be capacitively coupled to the reference voltage node or to another or other low impedance nodes. Indeed, in certain cases it is envisaged that not all of the coupling nodes coupling the sources of the respective transistors to the drain of the next transistor would be DC or capacitively coupled to a reference voltage node or a low impedance node.

While the coupling node has been described as being capacitively coupled to low voltage nodes, namely, the reference voltage node and the switching voltage node, it will be readily apparent to those skilled in the art that the coupling node may be capacitively coupled to any low impedance node in the switching circuit, for example, the control node or the bias voltage node, or indeed, to any other suitable low impedance node for attenuating the AC and other voltages capacitively coupled to the coupling node from the output node.

While the switch circuit and the open drain driver of FIG. 8 have been described with the open drain driver comprising a diode for DC coupling the coupling node to the reference voltage node, in certain cases, it is envisaged that the diode may be omitted, in which case the coupling node would not be DC coupled to the reference voltage node. Instead, attenuation of the voltage capacitively coupled onto the coupling node 9 from the output node 8 would be sufficiently attenuated by the parasitic capacitance of the second MOSFET MN3.

While specific values of coupling capacitors and specific relationships between the capacitance of the coupling capacitor and the drain-source parasitic capacitance of the first transistor of the open drain driver have been described, it will be appreciated that other values of capacitance and other relationships between the capacitance of the coupling capacitor and the parasitic capacitance of the first transistor may be used, and in particular, it will be appreciated that the value of the coupling capacitor and its relationship with the parasitic capacitance of the first transistor will largely be determined by the type of circuit, and in particular, the rated supply voltage of the circuit, as well as the size or sizes of the first and second transistors. Additionally, where the coupling capacitance for attenuating the voltage on the coupling node is to be provided solely by sizing the second transistor relative to the first transistor, it will be appreciated that the sizing again will be determined by the supply voltage rating of the circuit and the level of attenuation required.

The invention claimed is:

1. An open drain driver comprising:
a first transistor having a source, a drain coupled to an output node of the driver, and a gate coupled to a bias voltage node for receiving a bias voltage for maintaining the first transistor in a conducting state while the difference between the voltages on the gate and the source thereof is greater than or equal to the threshold voltage of the first transistor,
a second transistor having a drain coupled to the source of the first transistor through a coupling node, a source coupled to a switching voltage node for receiving a switching voltage, and a gate coupled to a control node for receiving a control signal for operating the second transistor selectively and alternately in a non-conducting state for maintaining the output node in a high impedance state, and a conducting state for applying the switching voltage on the switching voltage node to the output node when the first transistor is in the conducting state, and
a coupling element coupling the coupling node to a reference voltage node for receiving a reference voltage for limiting the voltage on the coupling node when the second transistor is in the non-conducting state, so that the drain-source voltage applied to the second transistor is within the reliability limit of the second transistor, the coupling element comprising a DC coupling element for DC coupling the coupling node to the reference voltage node, and a capacitive coupling element in parallel with the DC coupling element for capacitively coupling the coupling node to the reference voltage node.

2. An open drain driver as claimed in claim 1 in which the DC coupling element comprises a diode.

3. An open drain driver as claimed in claim 2 in which the first and second transistors are N-type transistors, and the diode is coupled to the coupling node for conducting current from the coupling node to the reference voltage node when the voltage on the coupling node exceeds the reference voltage on the reference voltage node by an amount equivalent to the conducting voltage of the diode.

4. An open drain driver as claimed in claim 2 in which the first and second transistors are P-type transistors and the diode is coupled to the coupling node for conducting current to the coupling node from the reference voltage node when the voltage on the coupling node drops below the reference voltage on the reference voltage node by an amount equivalent to the conducting voltage of the diode.

5. An open drain driver as claimed in claim 1 in which the bias voltage and the reference voltage are applied to the bias voltage node and the reference voltage node, respectively, and are of similar polarity, and the voltage values of the bias voltage and the reference voltage are the same or different.

6. An open drain driver as claimed in claim 5 in which the values of the bias voltage and the reference voltage are greater than the switching voltage applied to the switching voltage node when the first and second transistors are N-type transistors, and the values of the bias voltage and the reference voltage are less than the switching voltage applied to the switching voltage node when the first and second transistors are P-type transistors.

7. An open drain driver as claimed in claim 1 in which and the reference voltage node is a low impedance node.

8. An open drain driver as claimed in claim 7 in which the capacitive coupling element comprises a coupling capacitor, the capacitance of the coupling capacitor being selected so that the sum of the capacitance of the coupling capacitor and the parasitic capacitances of the first and second transistors through which the coupling node is coupled to low impedance nodes is sufficiently greater than the parasitic capacitance of the first transistor between the coupling node and the output node to provide sufficient attenuation of voltages capacitively coupled to the coupling node through the first transistor from the output node to maintain the drain-source voltage applied to the second transistor when the second transistor is in the non-conducting state within the reliability limit of the second transistor.

9. An open drain driver as claimed in claim 8 in which the capacitance of the coupling capacitor is at least one and a half times the parasitic capacitance of the first transistor between the coupling node and the output node when the first and second transistors are of substantially similar size.

10. An open drain driver as claimed in claim 8 in which the capacitance of the coupling capacitor is at least twice the parasitic capacitance of the first transistor between the coupling node and the output node when the first and second transistors are of substantially similar size.

11. An open drain driver as claimed in claim 1 in which the first and second transistors are field effect transistors (FETs).

12. An open drain driver as claimed in claim 1 in which the open drain driver is implemented in a CMOS process, and the first and second transistors are MOSFETs.

13. An open drain driver as claimed in claim 12 in which each MOSFET comprises a back gate, and the back gate is electrically tied to one of the drain and source of the MOSFET.

14. A switch circuit comprising:
a main input terminal,
a main output terminal,
a transistor switch located between the main input terminal and the main output terminal for selectively coupling the main output terminal to the main input terminal, the transistor switch comprising a source coupled to one of the main input and main output terminals, a drain coupled to the other of the main input and the main output terminals, and a gate coupled to a first control terminal for receiving a first control voltage for holding the transistor switch in one of a conducting state and a non-conducting state, and
an open drain driver having an output node coupled to the gate of the transistor switch for selectively applying a switching voltage to the gate of the transistor switch for operating the transistor switch in the other of the conducting and non-conducting states, the open drain driver comprising:
a first transistor having a source, a drain coupled to the output node thereof, and a gate coupled to a bias voltage node for receiving a bias voltage for maintaining the first transistor in a conducting state while the difference between the voltages on the gate and the source thereof is greater than or equal to the threshold voltage of the first transistor,
a second transistor having a drain coupled to the source of the first transistor through a coupling node, a source coupled to a switching voltage node for receiving the switching voltage, and a gate coupled to a control node for receiving a control signal for operating the second transistor selectively and alternately in a non-conducting state for maintaining the output node of the open drain driver in a high impedance state, and a conducting state for applying the switching voltage to the output node of the open drain driver, and in turn to the gate of the transistor switch when the first transistor is in the conducting state for operating the transistor switch in the other of the conducting state and the non-conducting state, and
a coupling element coupling the coupling node to a reference voltage node for receiving a reference voltage for limiting the voltage on the coupling node when the second transistor is in the non-conducting state, so that the drain-source voltage applied to the second transistor is within the reliability limit of the second transistor, the coupling element comprising a DC coupling element for DC coupling the coupling node to the reference voltage node, and a capacitive coupling element in parallel with the DC coupling element for capacitively coupling the coupling node to the reference voltage node.

15. A switch circuit as claimed in claim 14 in which the DC coupling element comprises a diode.

16. A switch circuit as claimed in claim 15 in which the first and second transistors are of the same P-type or N-type, and the diode is coupled to the coupling node and the reference voltage node for conducting current from the coupling node to the reference voltage node when the first and second transistors are N-type transistors and when the voltage on the coupling node exceeds the reference voltage on the reference voltage node by an amount equivalent to the conducting voltage of the diode, and the diode is coupled to the coupling node and the reference voltage node for conducting current to the coupling node from the reference voltage node when the first and second transistors are P-type transistors and when the voltage on the coupling node drops below the reference voltage on the reference voltage node by an amount equivalent to the conducting voltage of the diode.

17. A switch circuit as claimed in claim 14 in which the first and second transistors are provided by N-type transistors when the transistor switch is an N-type switch, and the first and second transistors are provided by P-type transistors when the transistor switch is a P-type transistor.

18. A switch circuit as claimed in claim 14 in which the gate of the transistor switch is AC coupled to one of the source and drain thereof for maintaining the voltage difference between the gate and the one of the source and drain to which the gate is AC coupled substantially constant when the one of the source and drain to which the gate is AC coupled is subjected to an AC signal.

19. A switch circuit as claimed in claim 14 in which and the reference voltage node is a low impedance node.

20. A switch circuit as claimed in claim 19 in which the capacitive coupling element comprises a coupling capacitor, the capacitance of the coupling capacitor being selected so that the sum of the capacitance of the coupling capacitor and the parasitic capacitances of the first and second transistors through which the coupling node is coupled to low impedance nodes is sufficiently greater than the parasitic capacitance of the first transistor between the coupling node and the output node to provide sufficient attenuation of voltages capacitively coupled to the coupling node through the first transistor from the output node to maintain the drain-source voltage applied to the second transistor when the second transistor is in the non-conducting state within the reliability limit of the second transistor.

21. A switch circuit as claimed in claim 20 in which the capacitance of the coupling capacitor is at least one and a half times the parasitic capacitance of the first transistor between the coupling node and the output node when the first and second transistors are of substantially similar size.

22. A switch circuit as claimed in claim 20 in which the capacitance of the coupling capacitor is at least twice the parasitic capacitance of the first transistor between the coupling node and the output node when the first and second transistors are of substantially similar size.

23. A switch circuit as claimed in claim 14 in which the transistor switch is held in the conducting state by the first control voltage, and the transistor switch is held in the non-conducting state by the switching voltage, and when the transistor switch is held in the conducting state by the first control voltage, the open drain driver presents a high impedance to the gate of the transistor switch.

24. A switch circuit comprising:
a main input terminal,
a main output terminal,
a switching circuit located between the main input terminal and the main output terminal for selectively coupling the main output terminal to the main input terminal, the switching circuit comprising an N-type transistor switch, and a P-type transistor switch arranged parallel to each other, with the drain of one of the transistor switches and the source of the other of the transistor switches being coupled together and being coupled to one of the main input and main output terminals, and the others of the source and drain of the respective transistor switches being coupled together and being coupled to the other of the main input and main output terminals, the N-type transistor switch having a gate coupled to a corresponding first control terminal for receiving a corresponding first control voltage for holding the N-type transistor switch in one of a conducting state and a non-conducting state, and the P-type transistor switch having a gate coupled to a second control terminal for receiving a second control voltage for holding the P-type transistor switch in one of the conducting and non-conducting states similar to the state of the N-type transistor switch, a first open drain driver having a corresponding output node coupled to the gate of the N-type transistor switch for applying a first switching voltage to the N-type transistor switch for operating the N-type transistor switch in the other of the conducting and non-conducting states, the first open drain driver comprising a corresponding first transistor having a source, a drain coupled to the corresponding output node of the first open drain driver, and a gate coupled to a first bias voltage node for receiving a first bias voltage for maintaining the first transistor in a conducting state while the difference between the voltages on the gate and the source thereof is greater than or equal to the threshold voltage of the first transistor, a corresponding second transistor having a drain coupled to the source of the corresponding first transistor through a coupling node, a source coupled to a first switching voltage node for receiving the first switching voltage, and a gate coupled to a corresponding control node for receiving a corresponding control signal for operating the second transistor selectively and alternately in a non-conducting state for maintaining the corresponding output node in a high impedance state, and a conducting state for coupling the first switching voltage to the corresponding output node when the corresponding first transistor is in the conducting state, and a corresponding coupling element for coupling the corresponding coupling node to a first reference voltage node for receiving a first reference voltage for limiting the voltage on the corresponding coupling node when the second transistor is in the non-conducting state, so that the drain-source voltage applied to the second transistor of the first open drain driver is within the reliability limit of the second transistor thereof, and a second open drain driver having a corresponding output node coupled to the gate of the P-type transistor switch for applying a second switching voltage to the P-type transistor switch for operating the P-type transistor switch in the other of the conducting and non-conducting states similar to the state of the N-type transistor switch, the second open drain driver comprising a corresponding first transistor having a source, a drain coupled to the corresponding output node of the second open drain driver, and a gate coupled to a second bias voltage node for receiving a second bias voltage for maintaining the first transistor in a conducting state while the difference between the voltages on the gate and the source thereof is greater than or equal to the threshold voltage of the first transistor, a corresponding second transistor having a drain coupled to the source of the corresponding first transistor through a corresponding coupling node, a source coupled to a second switching voltage node for receiving the second switching voltage, and a gate coupled to a corresponding control node for receiving a corresponding control signal for operating the second transistor selectively and alternately in a non-conducting state for maintaining the corresponding output node in a high impedance state, and a conducting state for coupling the second switching voltage to the corresponding output node when the corresponding first transistor is in the conducting state, and a coupling element for coupling the corresponding coupling node to a second reference voltage node for receiving a second reference voltage for limiting the voltage on the corresponding coupling node when the corresponding second transistor is in the non-conducting state, so that the drain-source voltage applied to the second transistor of the second open drain driver is within the reliability limit of the second transistor thereof, wherein the coupling element of at least one of the first and second open drain drivers comprises a DC coupling element for DC coupling the corresponding coupling node to the corresponding one of the first and second reference voltage nodes, and a capacitive coupling element in parallel with the DC coupling element for capacitively coupling the corresponding coupling node to the corresponding one of the first and second reference voltage nodes.

25. A switch circuit as claimed in claim 24 in which each DC coupling element comprises a diode.

26. A switch circuit as claimed in claim 24 in which at least one of the corresponding one of the first and second reference voltage nodes is a low impedance node.

27. A switch circuit as claimed in claim 26 in which each of the corresponding ones of the first and second reference voltage nodes is a low impedance node.

28. A switch circuit as claimed in claim 26 in which each capacitive coupling element comprises a coupling capacitor.

29. A switch circuit as claimed in claim 24 in which the coupling element of each of the first and second open drain drivers comprises a DC coupling element for DC coupling the corresponding coupling node to the corresponding one of the first and second reference voltage nodes, and a capacitive coupling element in parallel with the DC coupling element for capacitively coupling the corresponding coupling node to the corresponding one of the first and second reference voltage nodes.

30. A switch circuit as claimed in claim 24 in which the coupling node of at least one of the first and second open drain drivers is coupled to at least one low impedance node of the open drain driver, so that the sum of the capacitances through which the coupling node is coupled to low impedance nodes of the open drain driver is sufficiently greater than the parasitic capacitance of the first transistor between the coupling node and the output node of the open drain driver to provide sufficient attenuation of voltages capacitively coupled to the coupling node through the first transistor from the output node of the open drain driver to maintain the drain-source voltage applied to the corresponding second transistor of the open drain driver when the corresponding second transistor is in the non-conducting state within the reliability limit of the corresponding second transistor.

31. A switch circuit as claimed in claim 30 in which the capacitive coupling element comprises a capacitor.

32. A switch circuit as claimed in claim 30 in which the second transistor is sized relative to the first transistor of the at least one of the first and second open drain drivers to provide the capacitive coupling of the coupling node to the at least one low impedance node of the open drain driver, and the at least one low impedance node is the switching voltage node of the open drain driver and is provided as a low impedance node.

33. A method for providing an open drain driver with over-voltage breakdown protection, the method comprising the steps of:
providing a first transistor having a source, a drain coupled to an output node of the open drain driver, and a gate coupled to a bias voltage node to which a bias voltage is applied for maintaining the first transistor in a conducting state while the difference between the voltages on the gate and the source thereof is greater than or equal to the threshold voltage of the first transistor,
providing a second transistor having a drain coupled to the source of the first transistor through a coupling node, a source coupled to a switching voltage node for receiving a switching voltage, and a gate for receiving a control signal for operating the second transistor selectively and alternately in a non-conducting state for maintaining the output node in a high impedance state, and a conducting state for coupling the switching voltage on the switching voltage node to the output node when the first transistor is in the conducting state, and
coupling the coupling node through a DC coupling element and a capacitive coupling element in parallel with the DC coupling element to a reference voltage node to which a reference voltage is applied for limiting the voltage on the coupling node when the second transistor is in the non-conducting state, so that the drain-source voltage applied to the second transistor is within the reliability limit of the second transistor.

34. A method as claimed in claim 33 in which the DC coupling element comprises a diode.

35. A method as claimed in claim 33 in which, and the reference voltage node is a low impedance node.

36. A switch circuit comprising:
a main input terminal,
a main output terminal,
a transistor switch located between the main input terminal and the main output terminal for selectively coupling the main output terminal to the main input terminal, the transistor switch comprising a source coupled to one of the main input and main output terminals, a drain coupled to the other of the main input and the main output terminals, and a gate coupled to a first control terminal for receiving a first control voltage for holding the transistor switch in one of a conducting state and a non-conducting state,
a capacitor AC coupling the gate of the transistor switch to one of the source and drain thereof for maintaining the voltage difference between the gate and the one of the source and drain to which the gate is AC coupled substantially constant when the one of the source and drain to which the gate is AC coupled is subjected to an AC signal, and
an open drain driver having an output node coupled to the gate of the transistor switch for selectively applying a switching voltage to the gate of the transistor switch for operating the transistor switch in the other of the conducting and non-conducting states, the open drain driver comprising:
a first transistor having a source, a drain coupled to the output node thereof, and a gate coupled to a bias voltage node for receiving a bias voltage for maintaining the first transistor in a conducting state while the difference between the voltages on the gate and the source thereof is greater than or equal to the threshold voltage of the first transistor,
a second transistor having a drain coupled to the source of the first transistor through a coupling node, a source coupled to a switching voltage node for receiving the switching voltage, and a gate coupled to a control node for receiving a control signal for operating the second transistor selectively and alternately in a non-conducting state for maintaining the output node of the open drain driver in a high impedance state, and a conducting state for applying the switching voltage to the output node of the open drain driver, and in turn to the gate of the transistor switch when the first transistor is in the conducting state for operating the transistor switch in the other of the conducting state and the non-conducting state, and
a DC coupling element coupling the coupling node to a reference voltage node for receiving a low reference voltage for limiting the voltage on the coupling node when the second transistor is in the non-conducting state, so that the drain-source voltage applied to the second transistor is within the reliability limit of the second transistor, and
a capacitive coupling element is coupled in parallel with the DC coupling element between the coupling node and the reference node for capacitively coupling the coupling node to the reference voltage node.

37. A method as claimed in claim 33 in which the reference voltage node is a low impedance node.

38. A switch circuit comprising:
a main input terminal,
a main output terminal,
a transistor switch located between the main input terminal and the main output terminal for selectively coupling the main output terminal to the main input terminal, the transistor switch comprising a source coupled to one of the main input and main output terminals, a drain coupled to the other of the main input and the main output terminals, and a gate,
a resistor coupling the gate of the transistor switch to a first control terminal for receiving a first control voltage for holding the transistor switch in one of a conducting state and a non-conducting state,
an open drain driver having an output node coupled to the gate of the transistor switch for selectively applying a switching voltage to the gate of the transistor switch for operating the transistor switch in the other of the conducting and non-conducting states, the open drain driver comprising:
a first transistor having a source, a drain coupled to the output node thereof, and a gate coupled to a bias voltage node for receiving a bias voltage for maintaining the first transistor in a conducting state while the difference between the voltages on the gate and the source thereof is greater than or equal to the threshold voltage of the first transistor,
a second transistor having a drain coupled to the source of the first transistor through a coupling node, a source coupled to a switching voltage node for receiving the switching voltage, and a gate coupled to a control node for receiving a control signal for operating the second transistor selectively and alternately in a non-conducting state for maintaining the output node of the open drain driver in a high impedance state, and a conducting state for applying the switching voltage to the output node of the open drain driver, and in turn to the gate of the transistor switch when the first transistor is in the conducting state for operating the transistor switch in the other of the conducting state and the non-conducting state, a coupling element coupling the coupling node to a reference voltage node for receiving a reference voltage for limiting the voltage on the coupling node when the second transistor is in the non-conducting state, so that the drain-source voltage applied to the second transistor is within the reliability limit of the second transistor, the coupling element comprising a DC coupling element for DC coupling the coupling node to the reference voltage node, and a capacitive coupling element in parallel with the DC coupling element for capacitively coupling the coupling node to the reference voltage node, and a capacitor coupling the gate of the transistor switch to one of the source and drain thereof, the capacitor co-operating with the resistor coupling the gate of the transistor switch to the first control terminal to form a high pass filter for preventing low frequency signals on the one of the source and drain of the transistor switch, to which the capacitor is coupled, being coupled to the drain of the first transistor.

39. A switch circuit as claimed in claim 38 in which the DC coupling element comprises a diode.

40. A switch circuit as claimed in claim 38 in which the capacitive coupling element comprises a coupling capacitor, the capacitance of the coupling capacitor being selected so that the sum of the capacitance of the coupling capacitor and the parasitic capacitances of the first and second transistors through which the coupling node is coupled to low impedance nodes is sufficiently greater than the parasitic capacitance of the first transistor between the coupling node and the output node to provide sufficient attenuation of voltages capacitively coupled to the coupling node through the first transistor from the output node to maintain the drain-source voltage applied to the second transistor when the second transistor is in the non-conducting state within the reliability limit of the second transistor.

41. A switch circuit as claimed in claim 40 in which the capacitance of the coupling capacitor is at least one and a half times the parasitic capacitance of the first transistor between the coupling node and the output node when the first and second transistors are of substantially similar size.

42. A switch circuit as claimed in claim 40 in which the capacitance of the coupling capacitor is at least twice the parasitic capacitance of the first transistor between the coupling node and the output node when the first and second transistors are of substantially similar size.

43. A switch circuit comprising:
a main input terminal,
a main output terminal,
a transistor switch located between the main input terminal and the main output terminal for selectively coupling the main output terminal to the main input terminal, the transistor switch comprising a source coupled to one of the main input and main output terminals, a drain coupled to the other of the main input and the main output terminals, and a gate, a resistor coupling the gate of the transistor switch to a first control terminal for receiving a first control voltage for holding the transistor switch in one of a conducting state and a non-conducting state, an open drain driver having an output node coupled to the gate of the transistor switch for selectively applying a switching voltage to the gate of the transistor switch for operating the transistor switch in the other of the conducting and non-conducting states, the open drain driver comprising:

a first transistor having a source, a drain coupled to the output node thereof, and a gate coupled to a bias voltage node for receiving a bias voltage for maintaining the first transistor in a conducting state while the difference between the voltages on the gate and the source thereof is greater than or equal to the threshold voltage of the first transistor, a second transistor having a drain coupled to the source of the first transistor through a coupling node, a source coupled to a switching voltage node for receiving the switching voltage, and a gate coupled to a control node for receiving a control signal for operating the second transistor selectively and alternately in a non-conducting state for maintaining the output node of the open drain driver in a high impedance state, and a conducting state for applying the switching voltage to the output node of the open drain driver, and in turn to the gate of the transistor switch when the first transistor is in the conducting state for operating the transistor switch in the other of the conducting state and the non-conducting state, a coupling element coupling the coupling node to a low impedance reference voltage node for receiving a reference voltage for limiting the voltage on the coupling node when the second transistor is in the non-conducting state, so that the drain-source voltage applied to the second transistor is within the reliability limit of the second transistor, the coupling element comprising a DC coupling element for DC coupling the coupling node to the reference voltage node, and a capacitive coupling element for capacitively coupling the coupling node to the reference voltage node, and a capacitor coupling the gate of the transistor switch to one of the source and drain thereof, the capacitor co-operating with the resistor coupling the gate of the transistor switch to the first control terminal to form a high pass filter for preventing low frequency signals on the one of the source and drain of the transistor switch, to which the capacitor is coupled, being coupled to the drain of the first transistor.

* * * * *